United States Patent
Yang et al.

(10) Patent No.: US 12,176,037 B2
(45) Date of Patent: Dec. 24, 2024

(54) NON-VOLATILE MEMORY WITH DIFFERENT WORD LINE TO WORD LINE PITCHES

(71) Applicant: SanDisk Technologies LLC, Addison, TX (US)

(72) Inventors: Xiang Yang, Santa Clara, CA (US); Wei Cao, Fremont, CA (US); Jiacen Guo, Sunnyvale, CA (US)

(73) Assignee: SanDisk Technologies LLC, Addison, TX (US)

( * ) Notice: Subject to any disclaimer, the term of this patent is extended or adjusted under 35 U.S.C. 154(b) by 174 days.

(21) Appl. No.: 17/955,878

(22) Filed: Sep. 29, 2022

(65) Prior Publication Data

US 2024/0112735 A1    Apr. 4, 2024

(51) Int. Cl.
| | | |
|---|---|---|
| *G11C 16/04* | (2006.01) | |
| *G11C 16/08* | (2006.01) | |
| *G11C 16/10* | (2006.01) | |
| *G11C 16/24* | (2006.01) | |

(52) U.S. Cl.
CPC .......... *G11C 16/08* (2013.01); *G11C 16/0483* (2013.01); *G11C 16/10* (2013.01); *G11C 16/24* (2013.01)

(58) Field of Classification Search
None
See application file for complete search history.

(56) References Cited

U.S. PATENT DOCUMENTS

| | | |
|---|---|---|
| 8,951,859 B2 | 2/2015 | Higashitani |
| 9,484,314 B2 | 11/2016 | Shimoda |
| 10,157,680 B2 | 12/2018 | Yang et al. |
| 10,283,493 B1 | 5/2019 | Nishida |
| 10,629,616 B1 | 4/2020 | Kai |
| 10,726,920 B2 | 7/2020 | Yang |
| 2010/0244269 A1 | 9/2010 | Kim |
| 2013/0270568 A1 | 10/2013 | Rabkin et al. |
| 2013/0272069 A1 | 10/2013 | Rabkin et al. |
| 2014/0071763 A1 | 3/2014 | Shikata et al. |
| 2014/0108705 A1 | 4/2014 | Gorobets |
| 2014/0226415 A1 | 8/2014 | Toyama |
| 2014/0286095 A1 | 9/2014 | Hishida et al. |
| 2016/0049201 A1 | 2/2016 | Lue et al. |
| 2017/0076799 A1 | 3/2017 | Namai |
| 2017/0309339 A1 | 10/2017 | Hsiung |
| 2018/0197586 A1 | 7/2018 | Nguyen |
| 2019/0043836 A1 | 2/2019 | Fastow et al. |

(Continued)

FOREIGN PATENT DOCUMENTS

| | | |
|---|---|---|
| CN | 110998844 A | 4/2020 |
| KR | 20110135769 A | 12/2011 |

OTHER PUBLICATIONS

U.S. Appl. No. 17/469,016, filed Sep. 8, 2021.

(Continued)

*Primary Examiner* — Alfredo Bermudez Lozada
(74) *Attorney, Agent, or Firm* — Vierra Magen Marcus LLP

(57) ABSTRACT

In a multi-tiered non-volatile memory structure that can perform operations on sub-blocks, performance of the different tiers/sub-blocks is made consistent by using different word line to word line pitches in the different tiers/sub-blocks.

16 Claims, 23 Drawing Sheets

(56) References Cited

U.S. PATENT DOCUMENTS

| | | |
|---|---|---|
| 2019/0066788 A1 | 2/2019 | Louie |
| 2019/0088335 A1 | 3/2019 | Hsiung |
| 2020/0006371 A1 | 1/2020 | Huo et al. |
| 2020/0258817 A1 | 8/2020 | Okina |
| 2020/0286828 A1 | 9/2020 | Hosotani et al. |
| 2020/0303018 A1 | 9/2020 | Takizawa et al. |
| 2020/0365220 A1* | 11/2020 | Yang ................. G11C 16/3486 |
| 2020/0381316 A1 | 12/2020 | Lee |
| 2020/0402587 A1 | 12/2020 | Chibvongodze |
| 2021/0043244 A1 | 2/2021 | Choi et al. |
| 2021/0065799 A1 | 3/2021 | Kim et al. |
| 2021/0066278 A1 | 3/2021 | Kim et al. |
| 2021/0233900 A1 | 7/2021 | Kim et al. |
| 2022/0052010 A1 | 2/2022 | Goda et al. |
| 2024/0079069 A1* | 3/2024 | Yang ...................... G11C 16/08 |
| 2024/0096417 A1* | 3/2024 | Maejima ................ G11C 5/063 |

OTHER PUBLICATIONS

U.S. Appl. No. 17/246,469, filed Apr. 30, 2021.
U.S. Appl. No. 17/246,472, filed Apr. 30, 2021.
PCT International Search Report and Written Opinion dated Apr. 26, 2022, PCT Application No. PCT/US2022/012541.
PCT International Search Report and Written Opinion dated May 11, 2022, PCT Application No. PCT/US2022/012546.
Notice of Allowance dated Jun. 29, 2022, U.S. Appl. No. 17/246,472, filed Apr. 30, 2021.

* cited by examiner

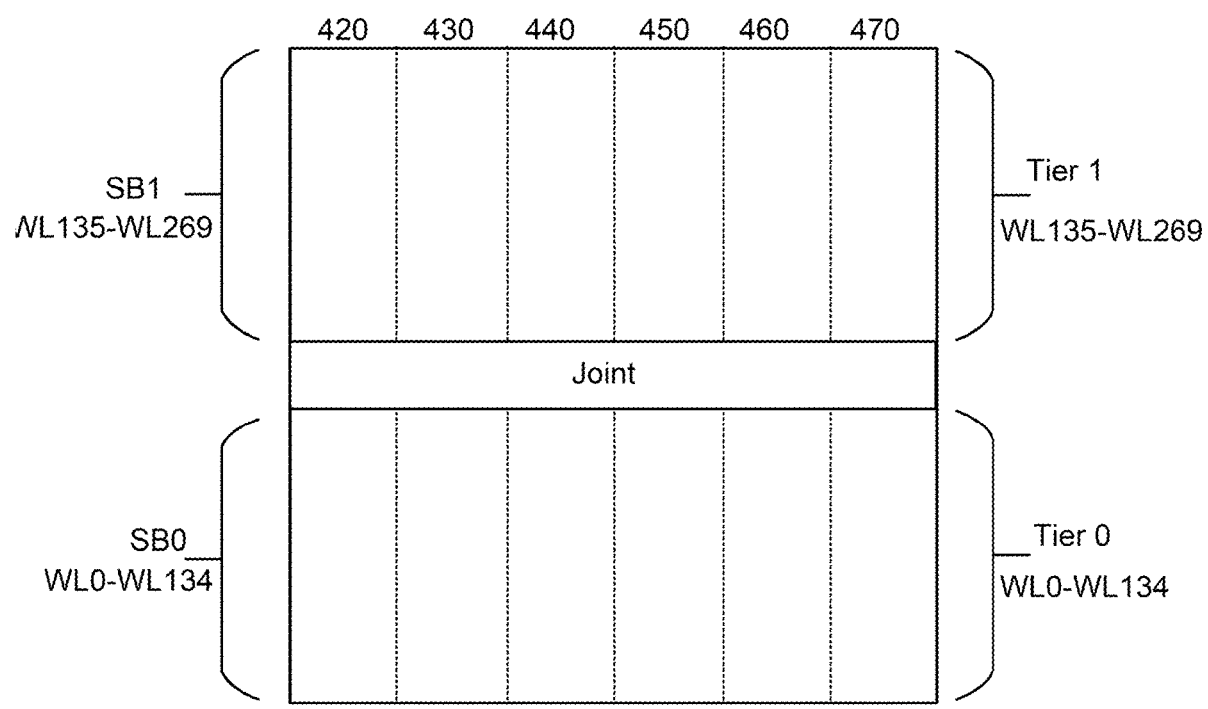
Figure 4C1

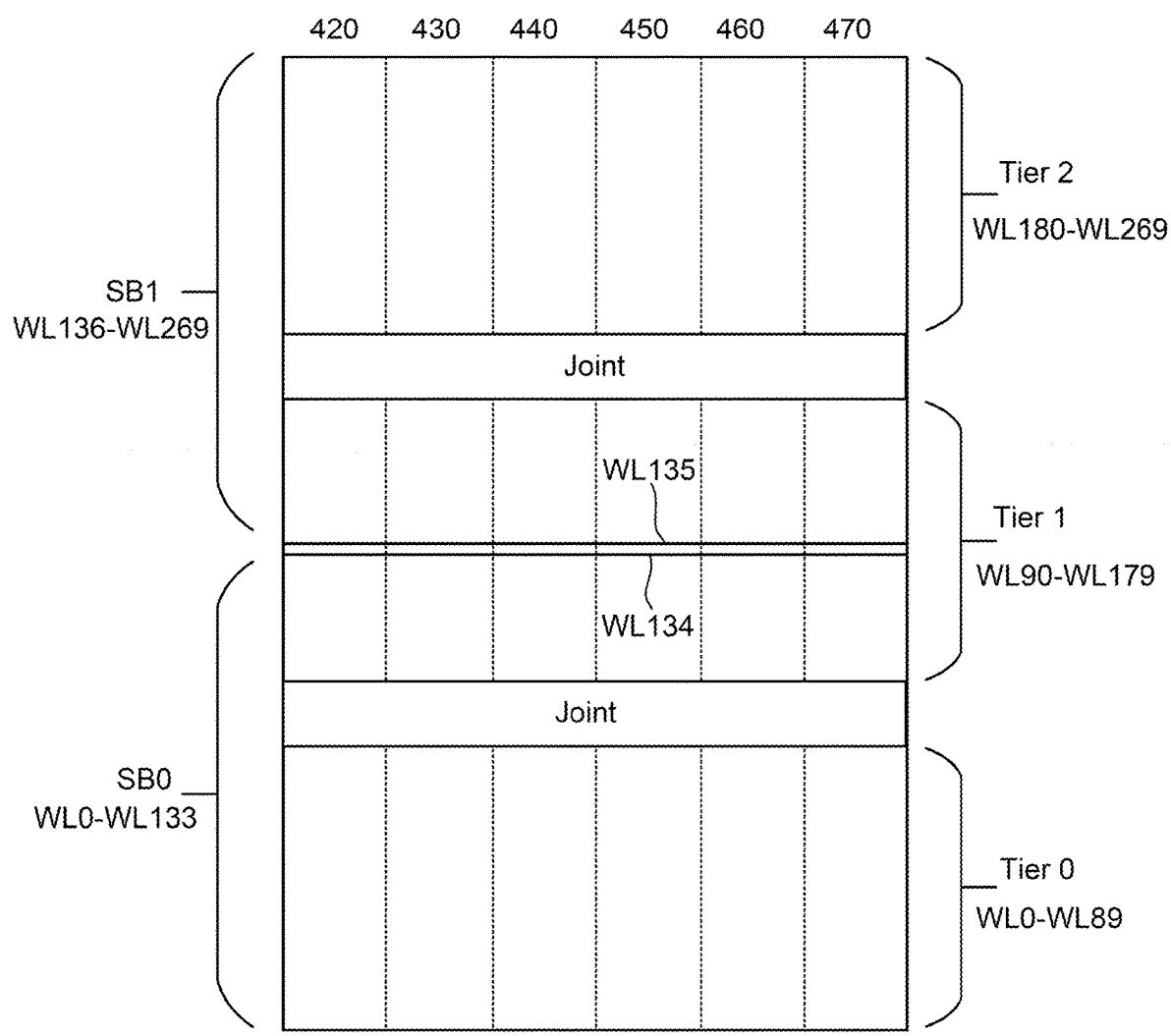
Figure 4C2

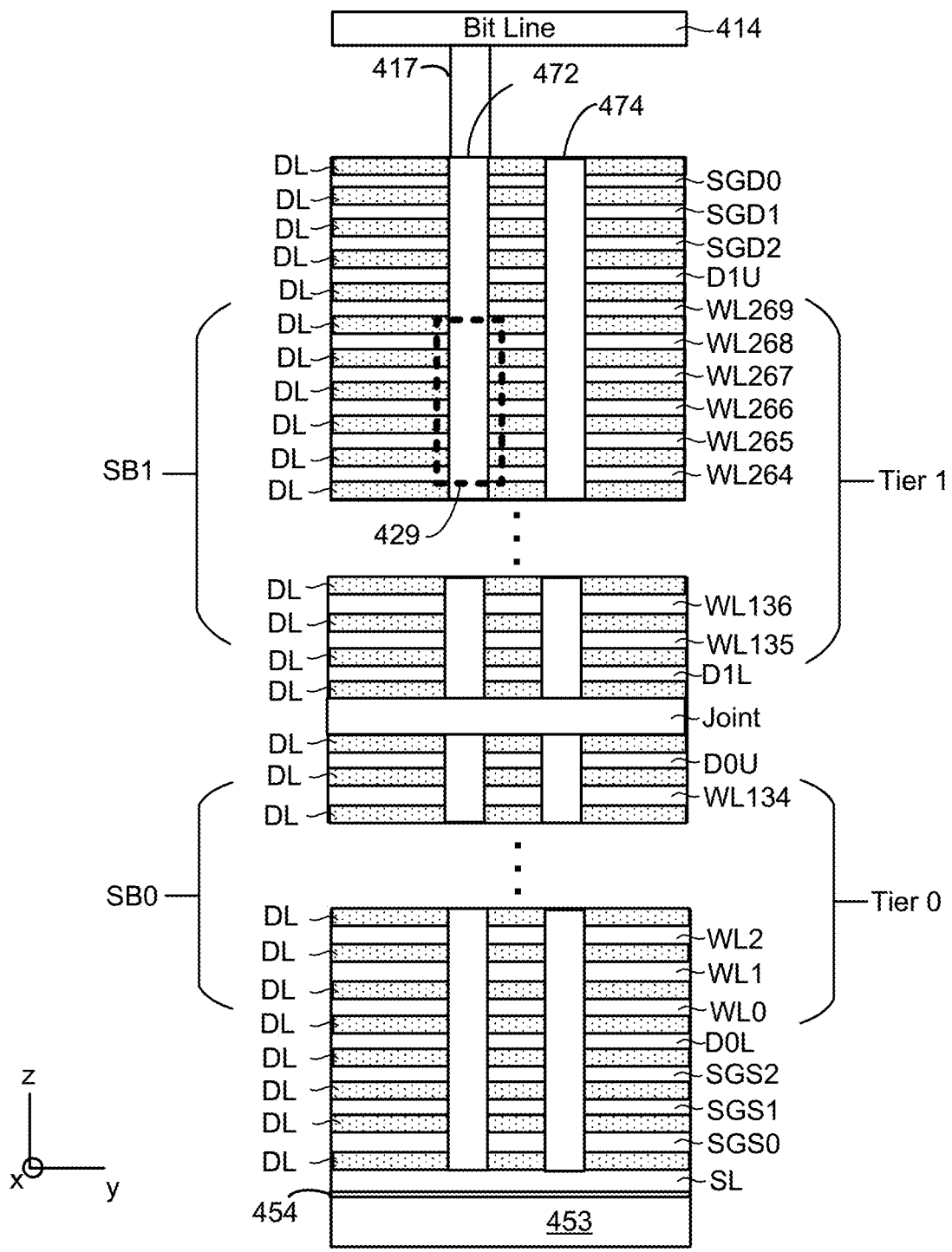
Figure 4D1
(Prior Art)

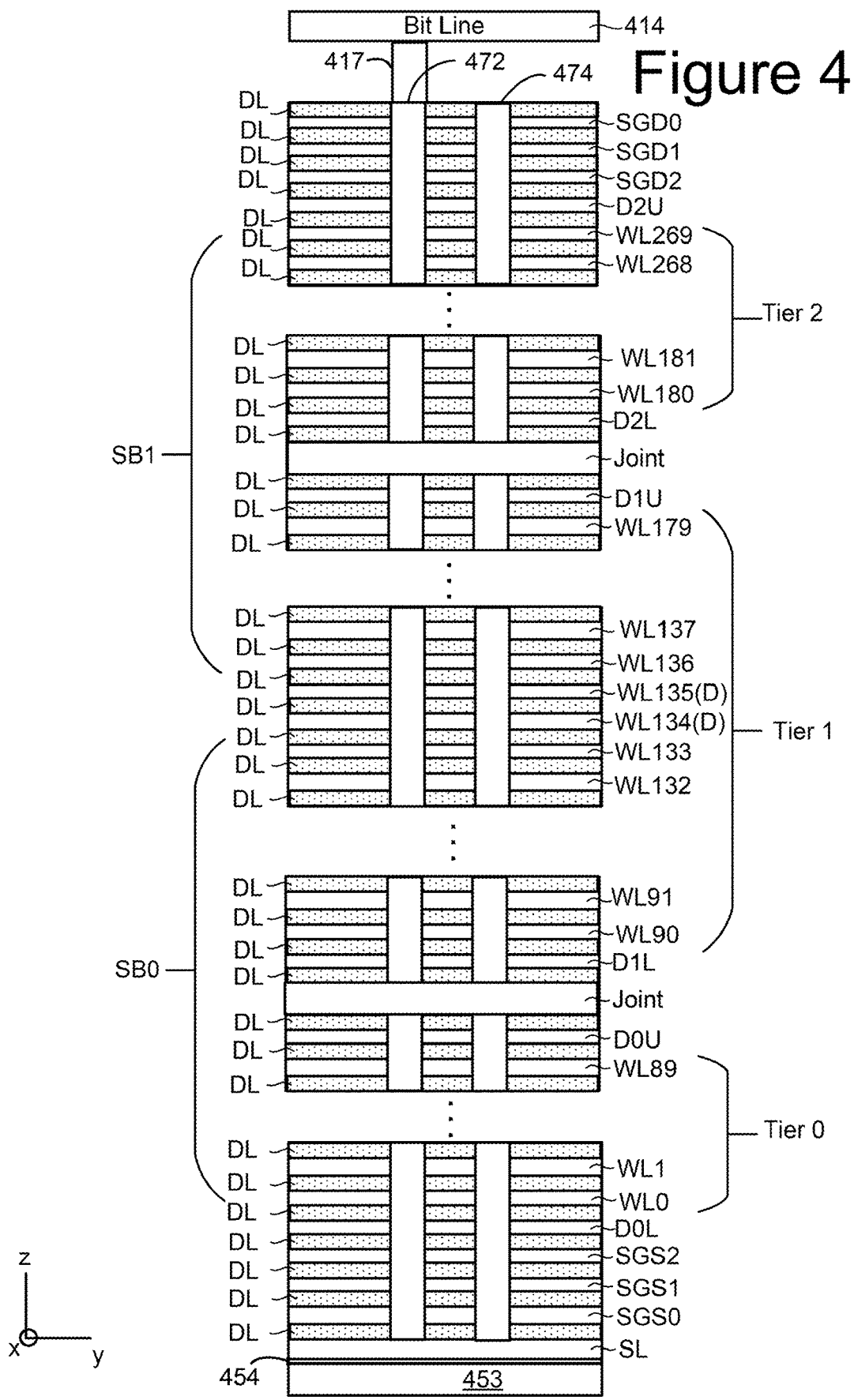
Figure 4D2

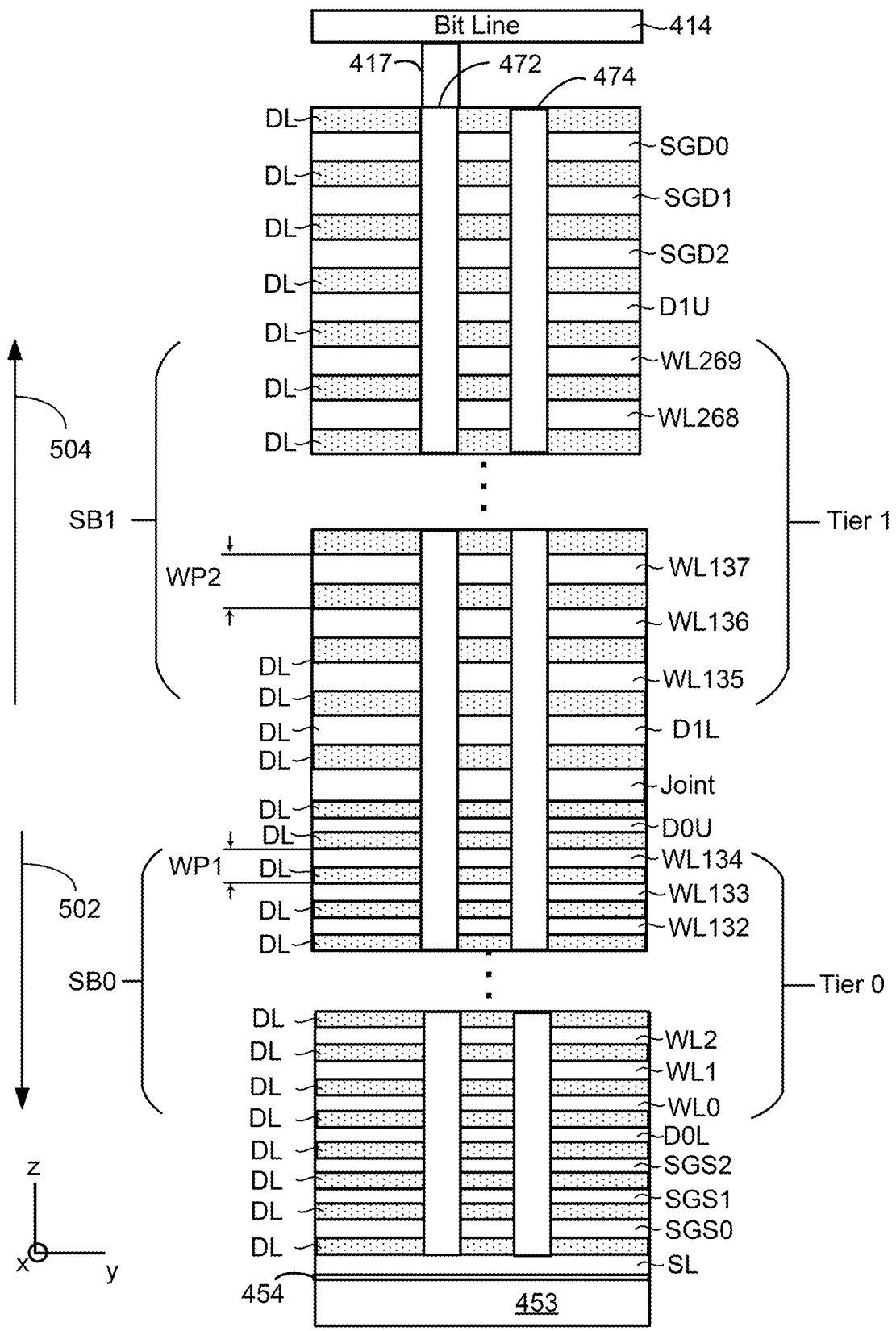
Figure 4D3

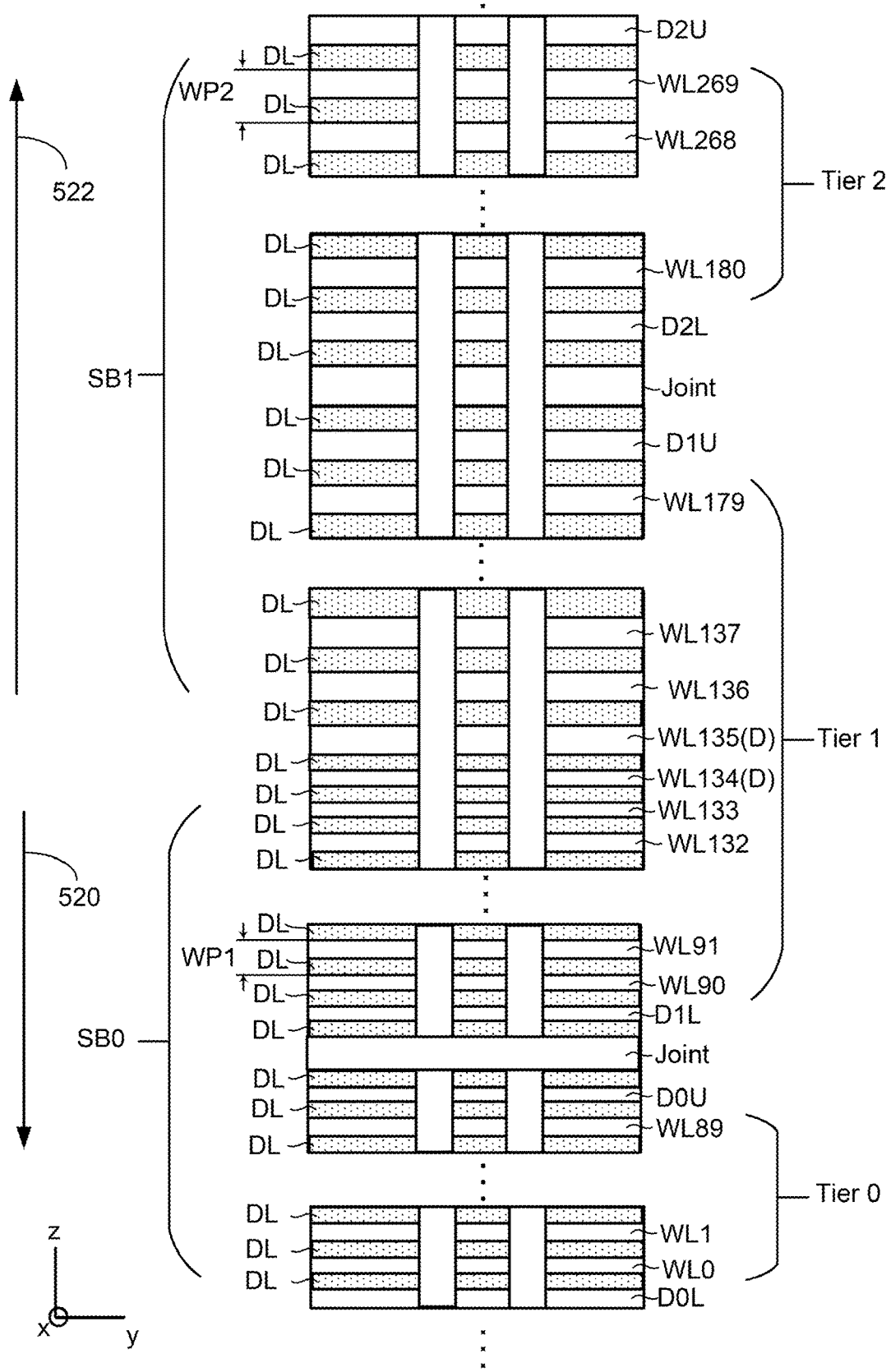
Figure 4D4

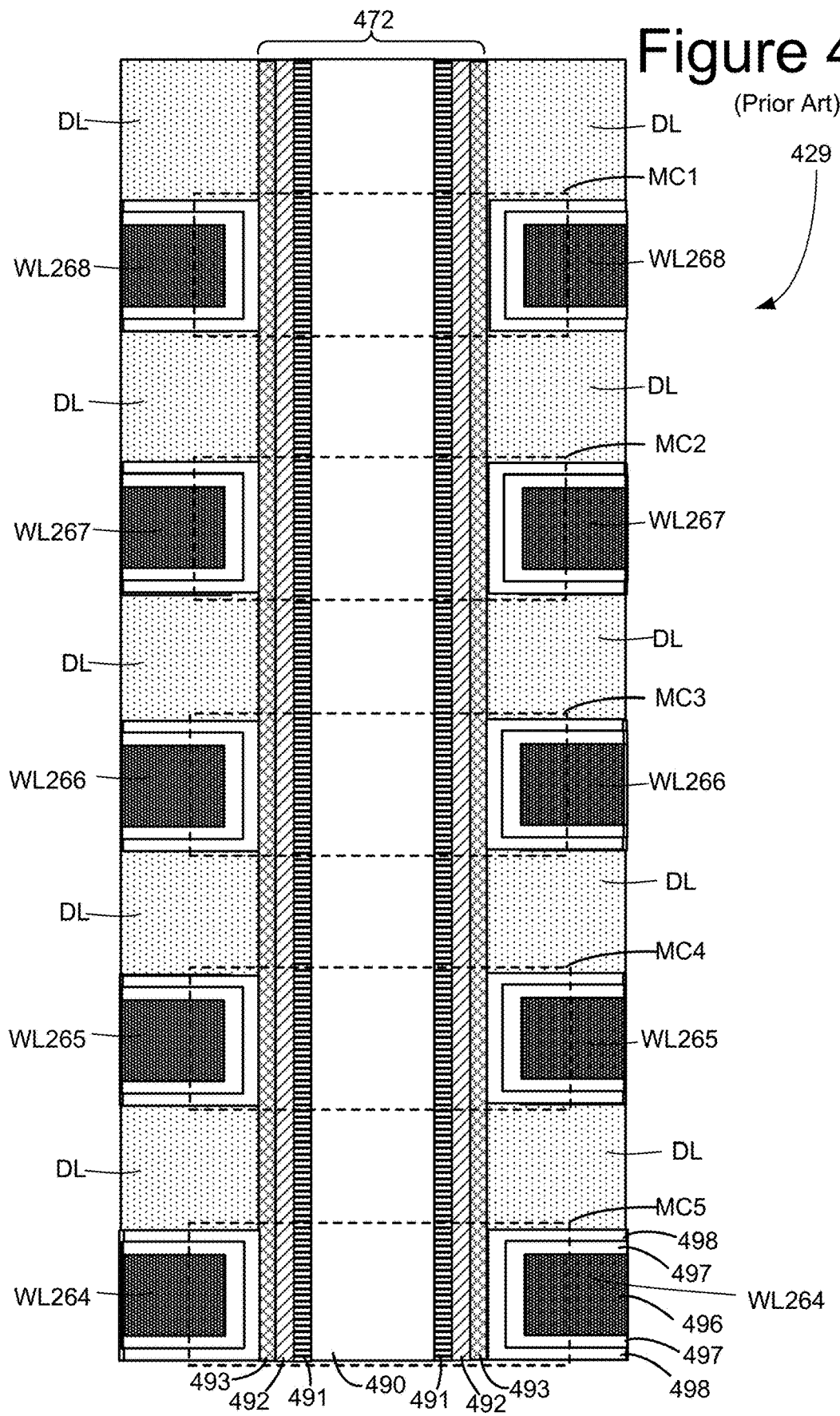

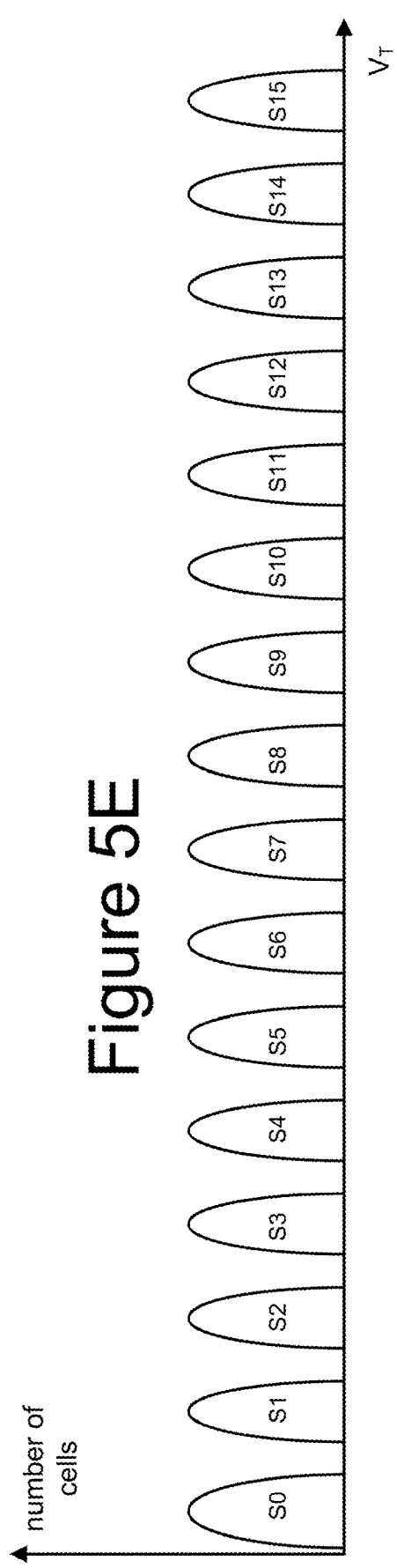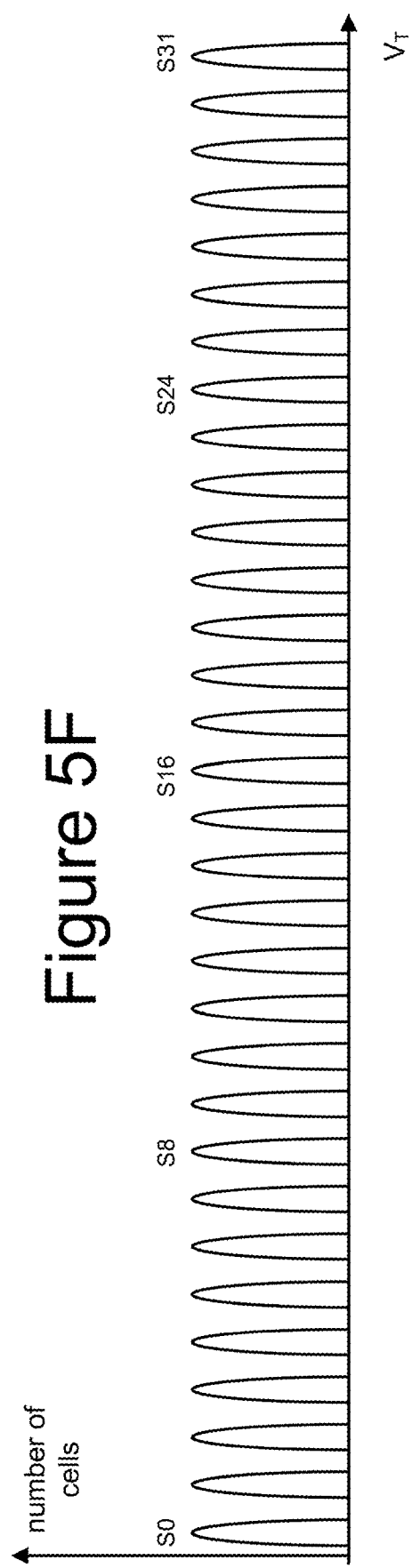

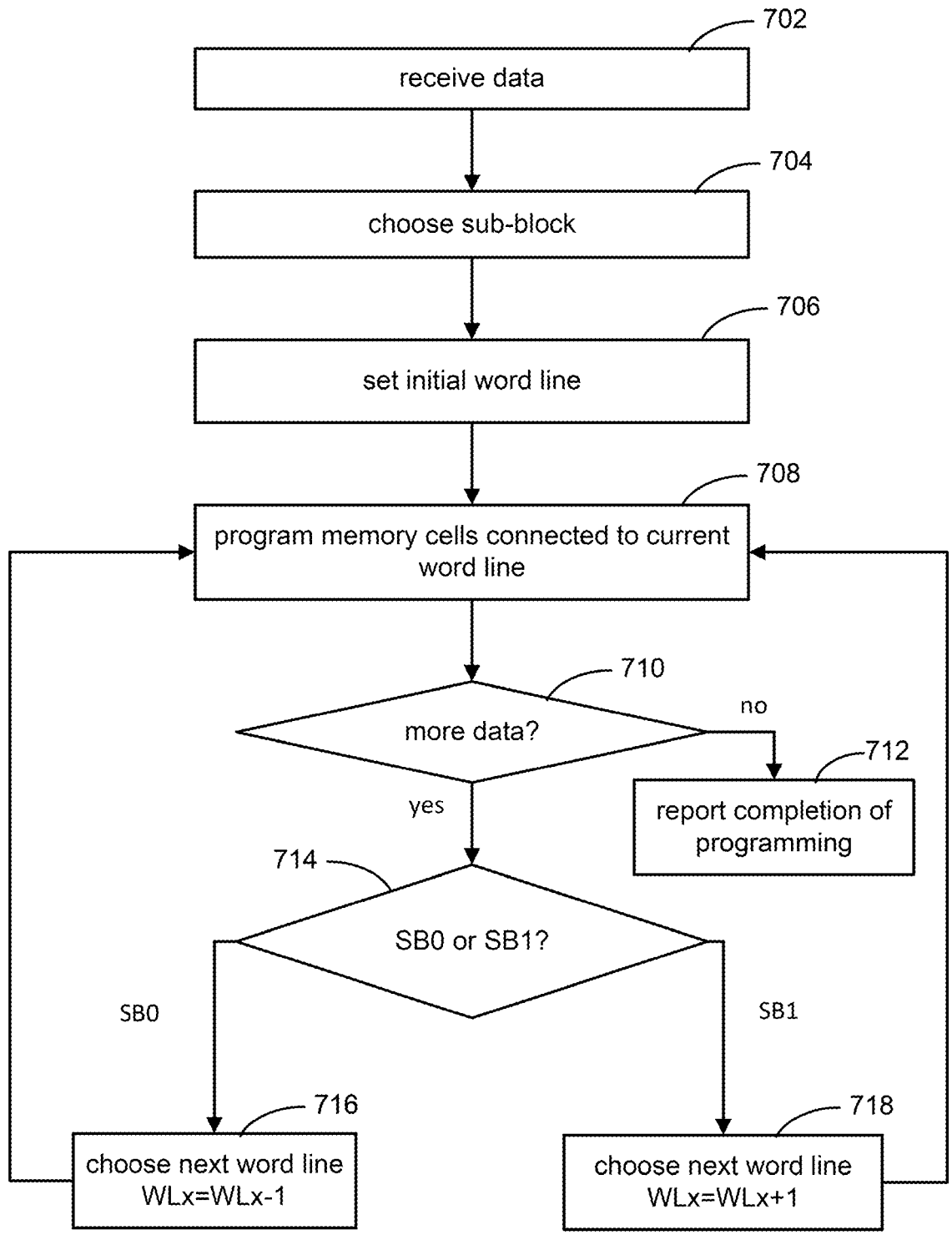

NON-VOLATILE MEMORY WITH DIFFERENT WORD LINE TO WORD LINE PITCHES

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory).

Users of non-volatile memory can program (i.e., write) data to the non-volatile memory and later read that data back. For example, a digital camera may take a photograph and store the photograph in non-volatile memory. Later, a user of the digital camera may view the photograph by having the digital camera read the photograph from the non-volatile memory. Because users often rely on the data they store, it is important to users of non-volatile memory to be able to store data reliably so that it can be read back successfully.

BRIEF DESCRIPTION OF THE DRAWINGS

Like-numbered elements refer to common components in the different figures.

FIG. 4C1 depicts a cross sectional view of a portion of one embodiment of a block of memory cells.

FIG. 4C2 depicts a cross sectional view of a portion of one embodiment of a block of memory cells.

FIG. 4D1 depicts a cross sectional view of a portion of one embodiment of a block of memory cells.

FIG. 4D2 depicts a cross sectional view of a portion of one embodiment of a block of memory cells.

FIG. 4D3 depicts a cross sectional view of a portion of one embodiment of a block of memory cells.

FIG. 4D4 depicts a cross sectional view of a portion of one embodiment of a block of memory cells.

FIG. 4F is a cross sectional view of one embodiment of a vertical column of memory cells.

FIG. 5E depicts threshold voltage distributions.

FIG. 5F depicts threshold voltage distributions.

FIG. 7 is a flow chart describing one embodiment of a process for programming non-volatile memory cells connected to multiple word lines.

DETAILED DESCRIPTION

Because there is a limit regarding the maximum height/depth that can be etched reliably, some non-volatile memories are fabricated as multiple tiers. Additionally, because blocks of memory with multiple tiers can be quite large, it is more efficient to operate the blocks in sub-block mode. However, as device size shrinks, differences in how the tiers/sub-blocks perform memory operations become more evident and these differences make it difficult to reliably operate the memory. To address this issue, it is proposed to use different word line to word line pitches in the different tiers and/or different sub-blocks.

Figure 1:
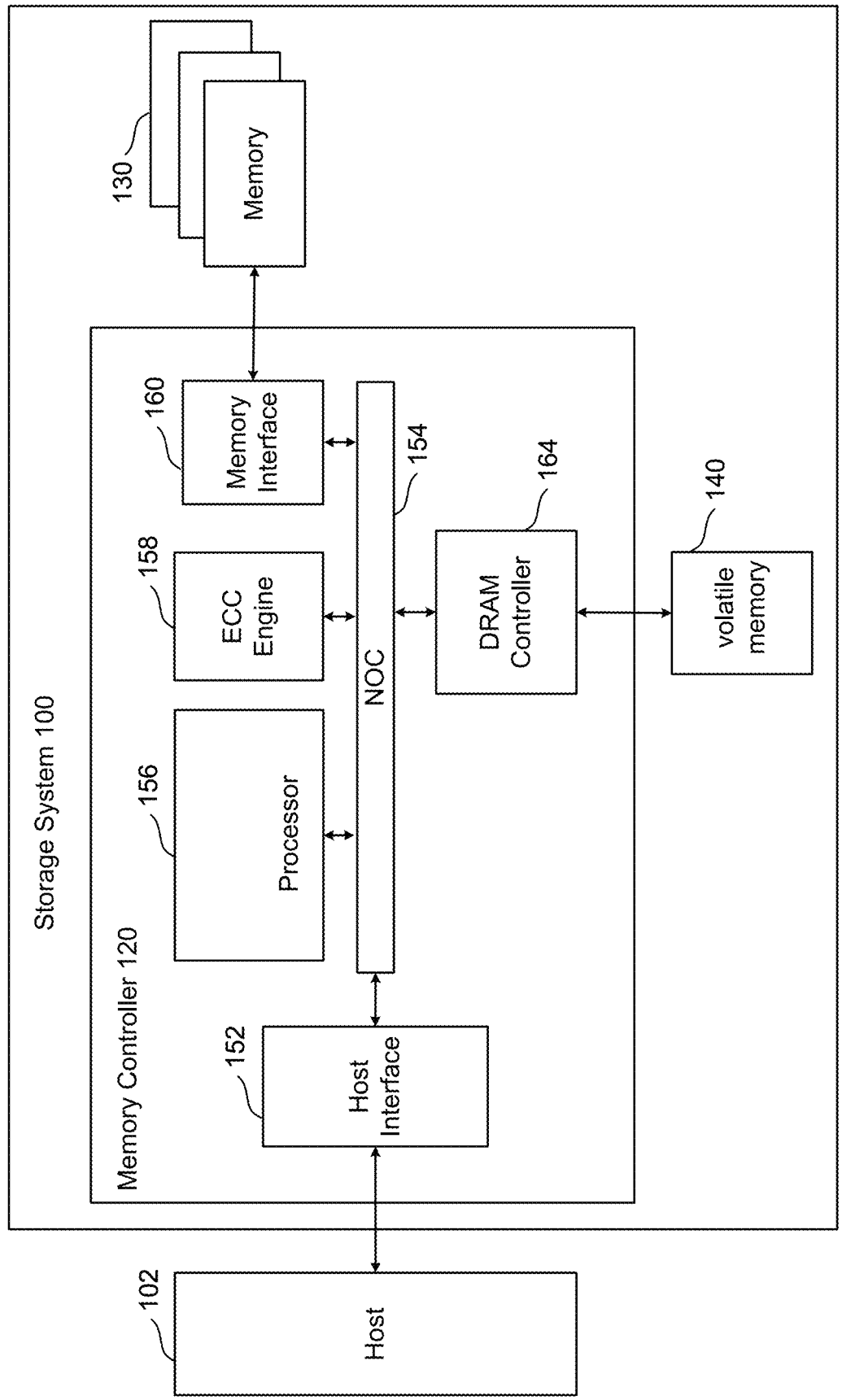
FIG. 1 is a block diagram depicting one embodiment of a storage system.

FIG. 1 is a block diagram of one embodiment of a non-volatile storage system 100 that implements the proposed technology described herein. In one embodiment, non-volatile storage system 100 is a solid state drive ("SSD"). Non-volatile storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 connected to non-volatile memory 130 and local high speed volatile memory 140 (e.g., DRAM). Local high speed volatile memory 140 is used by memory controller 120 to perform certain functions. For example, local high speed volatile memory 140 stores logical to physical address translation tables ("L2P tables").

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with non-volatile memory 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
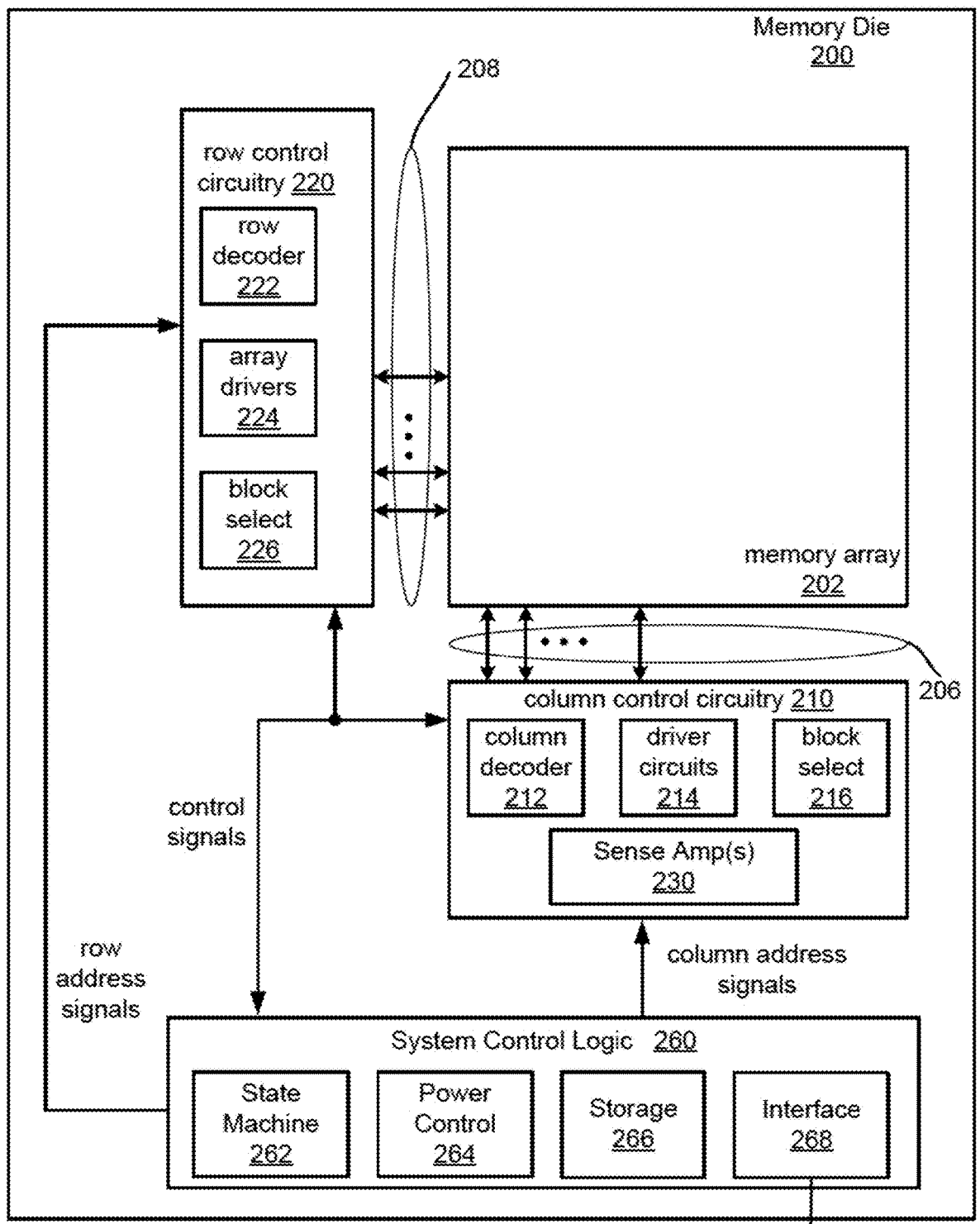
FIG. 2A is a block diagram of one embodiment of a memory die.

In one embodiment, non-volatile memory 130 comprises one or more memory die. FIG. 2A is a functional block diagram of one embodiment of a memory die 200 that comprises non-volatile memory 130. Each of the one or more memory die of non-volatile memory 130 can be implemented as memory die 200 of FIG. 2A. The components depicted in FIG. 2A are electrical circuits. Memory die 200 includes a memory array 202 that can comprise non-volatile memory cells, as described in more detail below. The array terminal lines of memory array 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory array 202. Row control circuitry 220 receives a group of M row address signals and one or more various control signals from System Control Logic circuit 206, and typically may include such circuits as row decoders 222, array terminal drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory array 202. Although only single block is shown for array 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, as well as read/write circuitry, and I/O multiplexers.

System control logic 260 receives data and commands from memory controller 120 and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 262 can also include a power control module 264 that controls the power and voltages supplied to the rows and columns of the memory structure 202 during memory operations and may include charge pumps and regulator circuit for creating regulating voltages. System control logic 262 includes storage 366 (e.g., RAM, registers, latches, etc.), which may be used to store parameters for operating the memory array 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all the components depicted in FIG. 2A other than memory structure 202. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ CMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
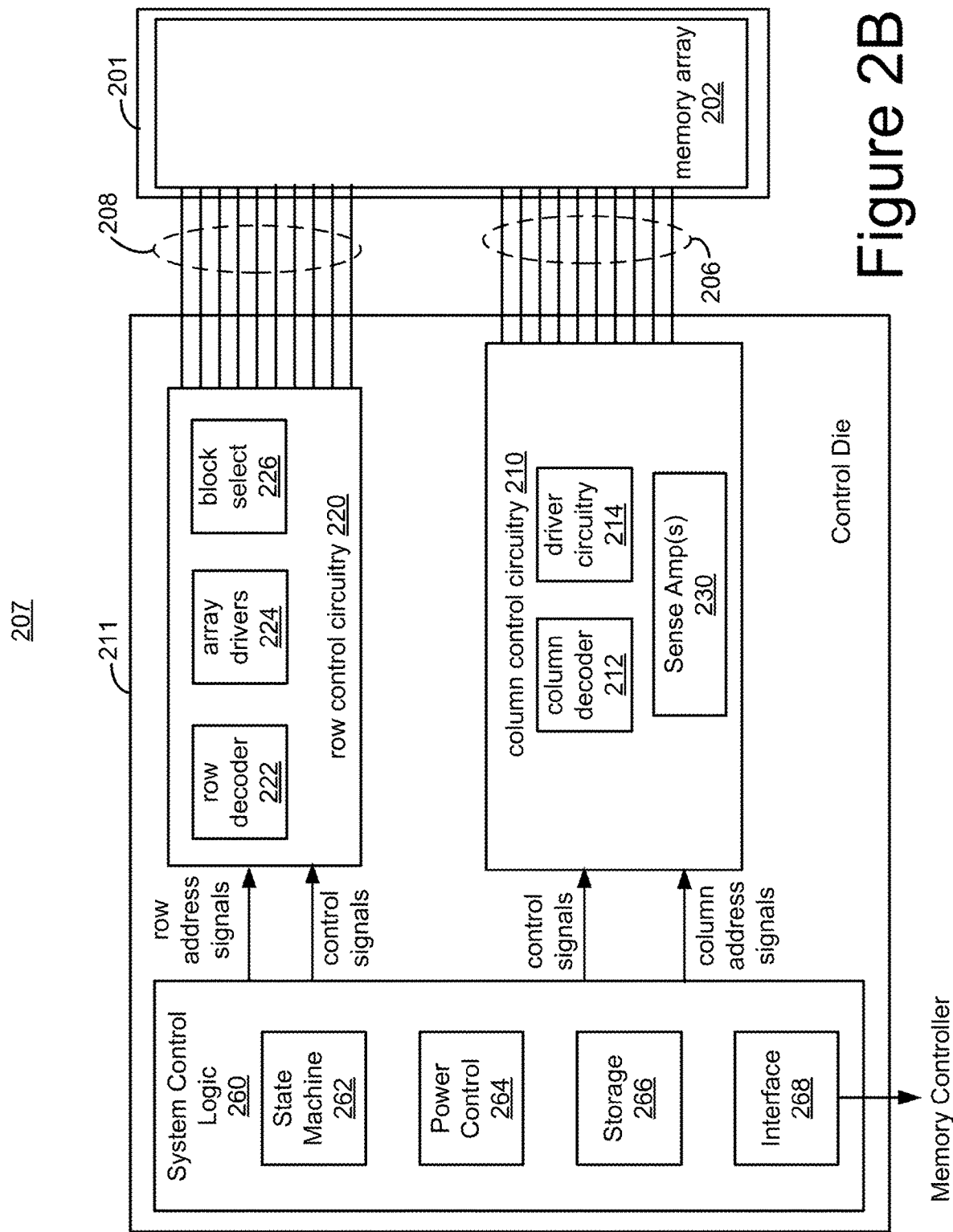
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile memory 130 of storage system 100. The integrated memory assembly 207 includes two types of semiconductor die (or more succinctly, "die"). Memory die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory die 201. In some embodiments, the memory die 201 and the control die 211 are bonded together.

FIG. 2B shows an example of the peripheral circuitry, including control circuits, formed in a peripheral circuit or control die 211 coupled to memory structure 202 formed in memory die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory die 201. In some embodiments, some of the circuitry in the system control logic 260 is located on the on the memory die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory 2 die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including sense amplifier(s) 230 on the control die 211 coupled to memory structure 202 on the memory die 201 through electrical paths 206. For example, electrical paths 206 may provide electrical connection between column decoder 212 and driver circuitry 214, and bit lines of memory structure 202. Electrical paths may extend from column control circuitry 210 in control die 211 through pads on control die 211 that are bonded to corresponding pads of the memory die 201, which are connected to bit lines of memory structure 202. Each bit line of memory structure 202 may have a corresponding electrical path in electrical paths 306, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory die 201.

For purposes of this document, the phrases "a control circuit" or "one or more control circuits" can include any one of or any combination of memory controller 120, state machine 262, all or a portion of system control logic 260, all or a portion of row control circuitry 220, all or a portion of column control circuitry 210, a microcontroller, a microprocessor, and/or other similar functioned circuits. The control circuit can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Figure 3A:
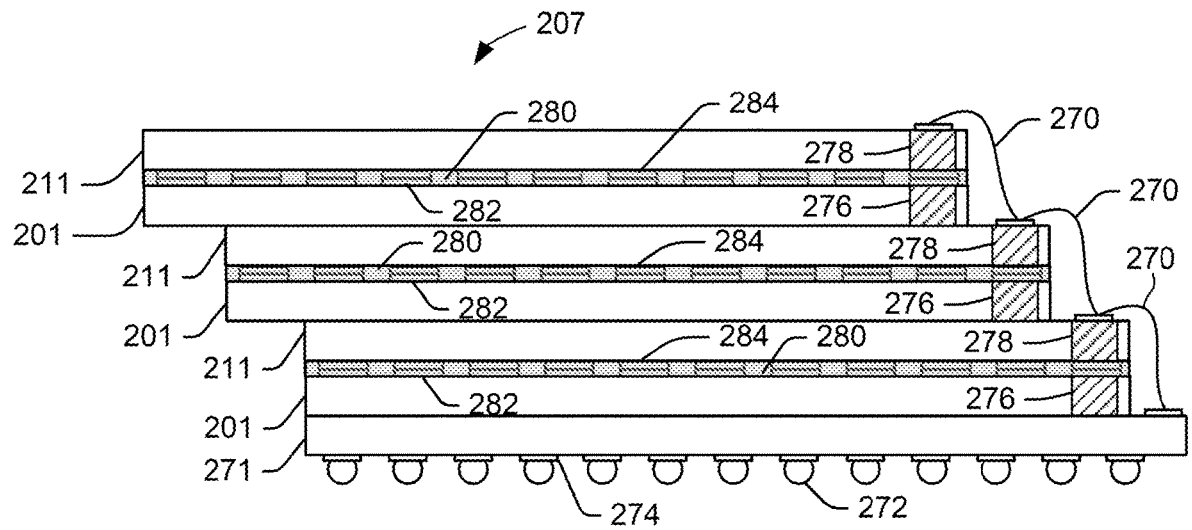
FIGS. 3A and 3B depict different embodiments of integrated memory assemblies.

In some embodiments, there is more than one control die 211 and more than one memory die 201 in an integrated memory assembly 207. In some embodiments, the integrated memory assembly 207 includes a stack of multiple control die 211 and multiple memory die 201. FIG. 3A depicts a side view of an embodiment of an integrated memory assembly 207 stacked on a substrate 271 (e.g., a stack comprising control dies 211 and memory dies 201). The integrated memory assembly 207 has three control dies 211 and three memory dies 201. In some embodiments, there are more than three memory dies 201 and more than three control die 211.

Each control die 211 is affixed (e.g., bonded) to at least one of the memory dies 201. Some of the bond pads 282/284 are depicted. There may be many more bond pads. A space between two dies 201, 211 that are bonded together is filled with a solid layer 280, which may be formed from epoxy or other resin or polymer. This solid layer 280 protects the electrical connections between the dies 201, 211, and further secures the dies together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
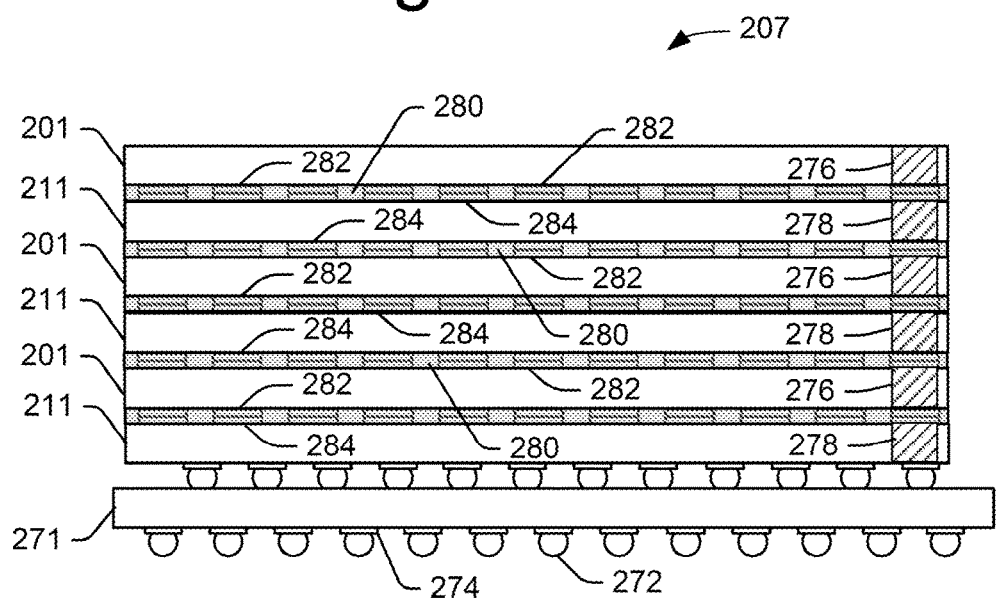

FIG. 3B depicts a side view of another embodiment of an integrated memory assembly 207 stacked on a substrate 271. The integrated memory assembly 207 of FIG. 3B has three control die 211 and three memory die 201. In some embodiments, there are many more than three memory dies 201 and many more than three control dies 211. In this example, each control die 211 is bonded to at least one memory die 201. Optionally, a control die 211 may be bonded to two or more memory die 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory die 201 may be bonded together. Bond pads on each die 201, 211 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 μm square and spaced from each other with a pitch of 1 μm to 5 μm. Bonding techniques may be used providing bond pads with even smaller sizes and pitches.

Some embodiments may include a film on surface of the dies 201, 211. Where no such film is initially provided, a space between the dies may be under filled with an epoxy or other resin or polymer. The under-fill material may be applied as a liquid which then hardens into a solid layer. This under-fill step protects the electrical connections between the dies 201, 211, and further secures the dies together. Various materials may be used as under-fill material, but in embodiments, it may be Hysol epoxy resin from Henkel Corp., having offices in California, USA.

Figure 4:
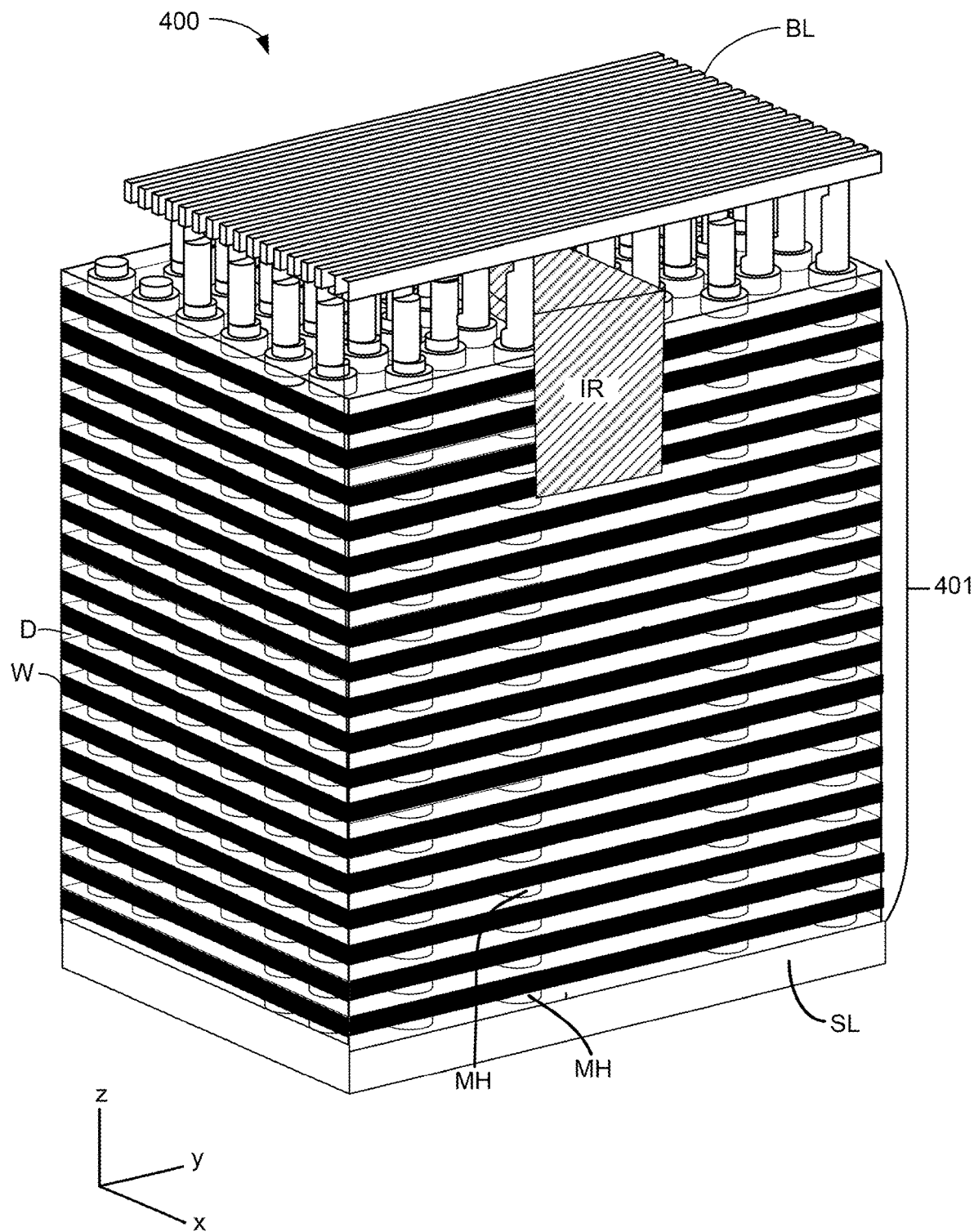
FIG. 4 is a perspective view of a portion of one embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example, one of the dielectric layers is marked as D and one of the conductive layers (also called word line layers) is marked as W. The number of alternating dielectric layers and conductive layers can vary based on specific implementation requirements. As will be explained below, in one embodiment the alternating dielectric layers and conductive layers are divided into six (or a different number of) regions by isolation regions IR. These regions are sometimes referred to as fingers or strings. FIG. 4 shows one isolation region IR separating two regions. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
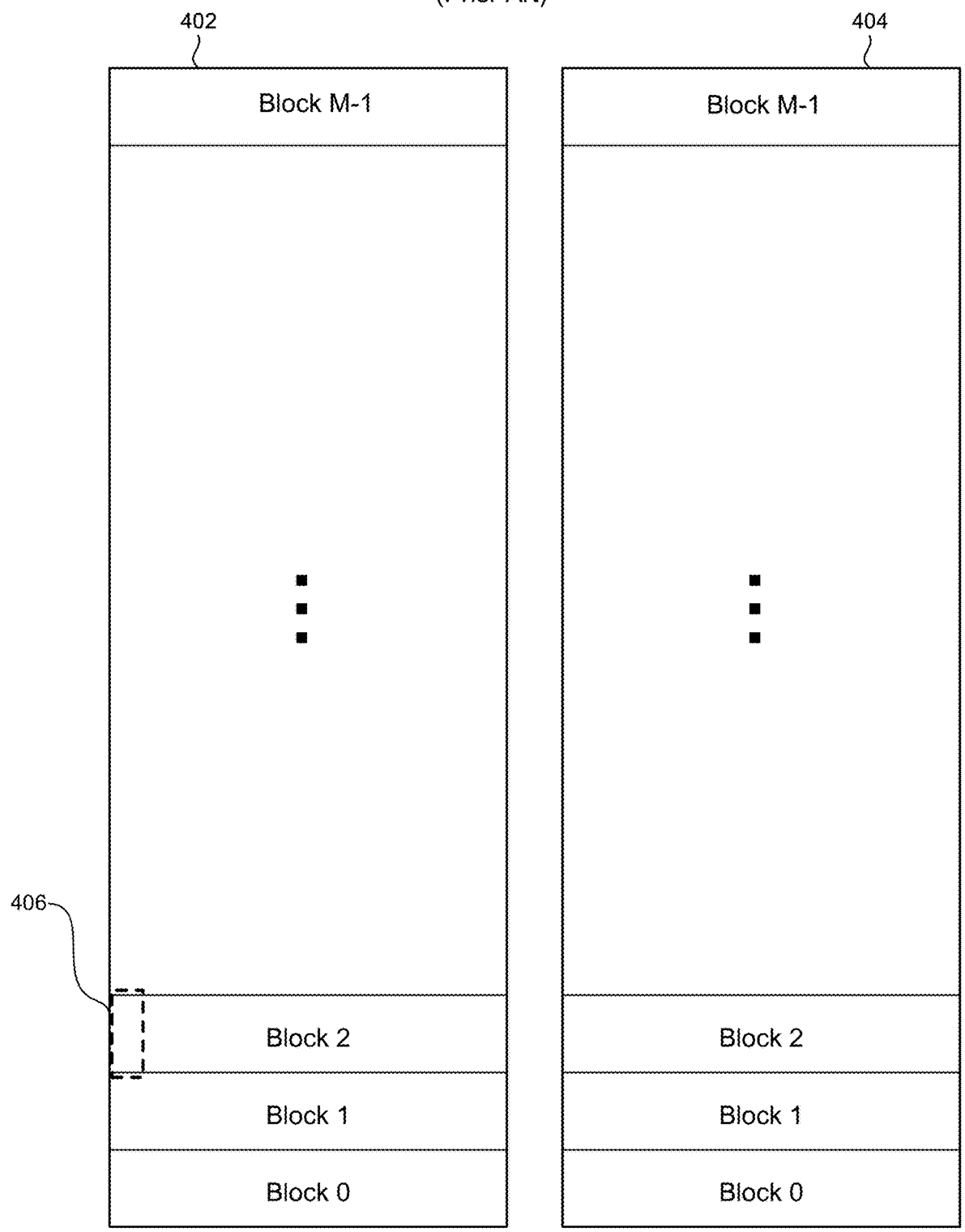
FIG. 4A is a block diagram of one embodiment of a memory structure having two planes.

FIG. 4A is a block diagram explaining one example organization of memory structure 202, which is divided into two planes 402 and 404. Each plane is then divided into M blocks. In one example, each plane has about 2000 blocks. However, different numbers of blocks and planes can also be used. In on embodiment, a block of memory cells is a unit of erase. That is, all memory cells of a block are erased together. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all the vertical NAND strings for that block. Although FIG. 4A shows two planes 402/404, more or less than two planes can be implemented. In some embodiments, memory structure 202 includes four planes, eight planes or more than eight planes.

Figure 4B:
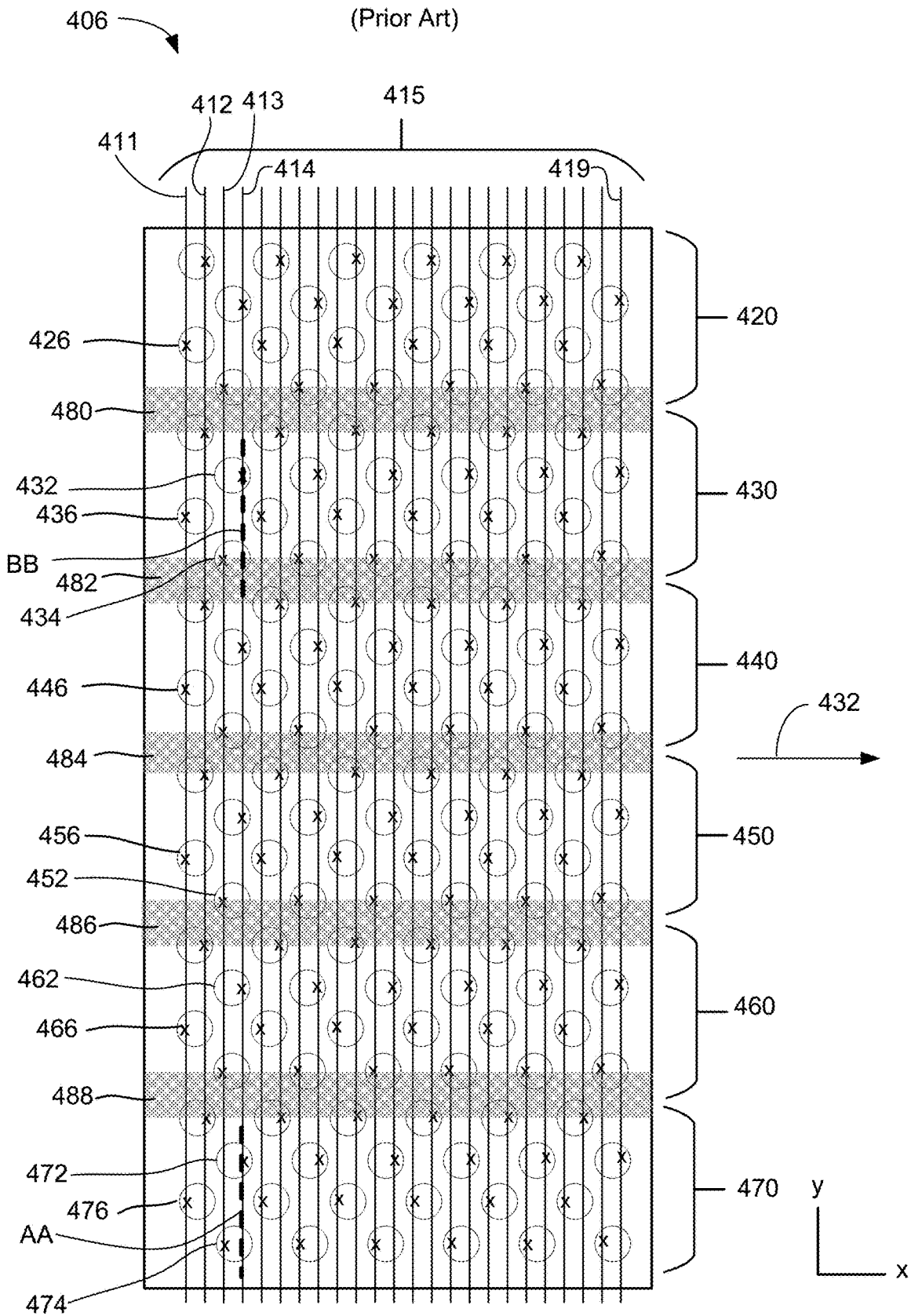
FIG. 4B depicts a top view of a portion of one embodiment of a block of memory cells.

FIGS. 4B-4J depict an example three dimensional ("3D") NAND structure that corresponds to the structure of FIG. 4 and can be used to implement memory structure 202 of FIGS. 2A and 2B. FIG. 4B is a block diagram depicting a top view of a portion 406 of Block 2 of plane 402. As can be seen from FIG. 4B, the block depicted in FIG. 4B extends in the direction of 432. In one embodiment, the memory array has many layers; however, FIG. 4B only shows the top layer.

FIG. 4B depicts a plurality of circles that represent the vertical columns, which correspond to the memory holes.

Each of the vertical columns include multiple select transistors (also referred to as a select gate or selection gate) and multiple memory cells. In one embodiment, each vertical column implements a NAND string. For example, FIG. 4B labels a subset of the vertical columns/NAND strings 426, 432, 436, 446, 456, 462, 466, 472, 474 and 476.

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 411 is connected to vertical columns 426, 436, 446, 456, 466 and 476.

The block depicted in FIG. 4B includes a set of isolation regions 480, 482, 484, 486 and 488, which are formed of SiO$_2$; however, other dielectric materials can also be used. Isolation regions 480, 482, 484, 486 and 488 serve to divide the top layers of the block into six regions; for example, the top layer depicted in FIG. 4B is divided into regions 420, 430, 440, 450, 460 and 470. In one embodiment, the isolation regions only divide the layers used to implement select gates (e.g., SGD) so that NAND strings in different regions can be independently selected. In one example implementation, a bit line only connects to one vertical column/NAND string in each of regions 420, 430, 440, 450, 460 and 470. In that implementation, each block has twenty four rows of active columns and each bit line connects to six rows in each block. In one embodiment, all of the six vertical columns/NAND strings connected to a common bit line are connected to the same word line (or set of word lines); therefore, the system uses the drain side selection lines (SGD) to choose one (or another subset) of the six to be subjected to a memory operation (program, verify, read, and/or erase).

Although FIG. 4B shows each region 420, 430, 440, 450, 460 and 470 having four rows of vertical columns, six regions and twenty four rows of vertical columns in a block, those exact numbers are an example implementation. Other embodiments may include more or less regions per block, more or less rows of vertical columns per region and more or less rows of vertical columns per block. FIG. 4B also shows the vertical columns being staggered. In other embodiments, different patterns of staggering can be used. In some embodiments, the vertical columns are not staggered.

FIG. 4C1 depicts a side view of portion 406 of Block 2 of plane 402, that is also depicted in FIG. 4B. The side view of FIG. 4C1 shows an embodiment of the memory array implemented as a two tier architecture, with each tier separate by a Joint region. Each of regions 420-470 run across the tiers (and sub-blocks). The first tier (Tier 0) comprises word lines WL0-WL134. The second tier (Tier 1), which is positioned above Tier 0, comprises word lines WL135-WL269. More or less than 270 word lines can be used and different divisions of word lines to the tiers can be implemented.

In one set of embodiments, the memory can be implemented in sub-block mode. That is, blocks are divided into two or more sub-blocks and each sub-block can be independently programmed, read and/or erased. FIG. 4C1 shows an example of a block divided into two sub-blocks: SB0 and SB1. Sub-block SB1 is positioned above sub-block SB0. In the depicted embodiment, the first sub-block SB0 comprises word lines WL0-WL134 and the second sub-block SB1 comprises word lines WL135-WL269; therefore, Tier 0 is operated as sub-block SB0 and Tier 1 is operated as sub-block SB1. However, in other examples, the tiers may correspond to different sub-blocks, or sub-blocks may correspond to partial tiers or more than one tier.

FIG. 4C2 depicts a side view of portion 406 of Block 2 of plane 402, showing an embodiment of the memory array implemented as a three tier architecture, with each tier separate by a Joint region. Each of regions 420-470 run across the tiers (and sub-blocks). The first tier (Tier 0) comprises word lines WL0-WL89. The second tier (Tier 1), which is positioned above Tier 0, comprises word lines WL90-WL179. The third tier (Tier 2), which is positioned above Tier 1, comprises word lines WL180-WL269. More or less than 270 word lines can be used and the different divisions of word lines to the tiers can be implemented. FIG. 4C2 shows an example of a block divided into two sub-blocks: SB0 and SB1. Sub-block SB1 is positioned above sub-block SB0. In the depicted embodiment, the first sub-block SB0 comprises word lines WL0-WL133 and the second sub-block SB1 comprises word lines WL136-WL269; therefore, Tier 0 and the bottom portion of Tier 1 are operated as sub-block SB0 and Tier 2 and the top portion of Tier 1 are operated as sub-block SB1. In the depicted arrangement of FIG. 4C2, word lines WL134 and WL135 are operated as dummy word lines to provide a buffer between the sub-blocks. In other embodiments, more or less than two word lines can be operated as a buffer between the sub-blocks. In other examples, the tiers may correspond to different sub-blocks, or sub-blocks may correspond to partial tiers or more than one tier. Other embodiments can include more than two sub-blocks.

FIG. 4D1 depicts a portion of one embodiment of a three dimensional memory structure 202 showing a cross-sectional view along line AA of FIG. 4B. The embodiment of FIG. 4D1 corresponds to the structure of FIG. 4C1. This cross sectional view cuts through vertical columns (NAND strings) 472 and 474 of region 470 (see FIG. 4B). The structure of FIG. 4D1 includes three drain side select layers SGD0, SGD1 and SGD2 (that form select lines); three source side select layers SGS0, SGS1, and SGS2 (that form select lines); dummy word line layers D0L, D0U, D1L, and D1U for connecting to dummy memory cells (that do not store data from a host); two hundred and seventy data word line layers WL0-WL269 for connecting to data memory cells (that store data), and dielectric layers DL. Other embodiments can implement more or less than the numbers described above for FIG. 4D. In one embodiment, SGD0, SGD1 and SGD2 are connected together; and SGDS0, SGS1 and SGS2 are connected together.

Vertical columns 472 and 474 are depicted protruding through the drain side select layers, source side select layers, dummy word line layers and word line layers. In one embodiment, each vertical column comprises a vertical NAND string. Below the vertical columns and the layers listed below is substrate 453, an insulating film 454 on the substrate, and source line SL. The NAND string of vertical column 472 has a source end at a bottom of the stack and a drain end at a top of the stack. As in agreement with FIG. 4B, FIG. 4D shows vertical column 442 connected to bit line 414 via connector 417.

For ease of reference, drain side select layers; source side select layers, dummy word line layers and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings to form a block having two tiers (Tier 0 and Tier 1) as well as two sub-blocks (SB0 and SB1), as described above with respect to FIG. 4C1. The word line layers WL0-W269 connect to memory cells (also called data memory cells). Each NAND string of the block includes memory cells in each of the two tiers; for example, memory cells connected to word lines WL0-WL134 are in Tier 0, and memory cells connected to word lines WL135-WL260 are in Tier1. Dummy word line layers connect to dummy memory cells. A dummy memory cell does not store and is not eligible to store host data (data provided from the host or entity outside of the storage system 100), while a data memory cell is eligible to store host data. Host data can be contrasted with system data that is generated by memory system 100 (e.g., L2P tables). In some embodiments, data memory cells and dummy memory cells may have a same structure. Drain side select layers SGD0, SGD1, and SGD2 are used to electrically connect and disconnect NAND strings from bit lines. Source side select layers SGS0, SGS1, and SGS2 are used to electrically connect and disconnect NAND strings from the source line SL.

FIG. 4D1 also shows Joint region. In one embodiment, it is expensive and/or challenging to etch so many word line layers intermixed with dielectric layers. To ease this burden, one embodiment includes laying down a first stack of word line layers alternating with dielectric layers (e.g., for Tier 0), laying down the Joint region, and laying down a second stack of word line layers alternating with dielectric layers (e.g., for Tier 1). The Joint region is positioned between the first stack and the second stack. In one embodiment, the Joint region is made from the polysilicon. The Joint region serves as a buffer layer allowing some misalignment between an upper tier and a lower tier.

FIG. 4D2 depicts a portion of another embodiment of a three dimensional memory structure 202 showing a cross-sectional view along line AA of FIG. 4B. The embodiment of FIG. 4D2 corresponds to the structure of FIG. 4C2. This cross sectional view cuts through vertical columns (NAND strings) 472 and 474 of region 470. The structure of FIG. 4D2 includes the same three tiers (Tier 0, Tier 1 and Tier 2), two Joint Regions and two sub-blocks (SB0 and SB1) as FIG. 4C2.

The structure of FIG. 4D2 includes the same drain side select layers SGD0, SGD1 and SGD2 (that form select lines); source side select layers SGS0, SGS1, and SGS2 (that form select lines); and data word lines (WL0-WL269) as FIG. 4D1. However, the structure of FIG. 4D2 includes a different set of dummy word lines than FIG. 4D1. For example, WL134 and WL135 are operated as dummy word lines, as discussed above. Also, FIG. 4D2 shows dummy word line layers on either side of the two Joint regions, including dummy word line layers D0L, D0U, D1L, D1U, D2L, and D2U for connecting to dummy memory cells.

FIG. 4D3 depicts a portion of another embodiment of a three dimensional memory structure 202 showing a cross-sectional view along line AA of FIG. 4B. The embodiment of FIG. 4D3 corresponds to the structure of FIG. 4C1. This cross sectional view cuts through vertical columns (NAND strings) 472 and 474 of region 470. The structure of FIG. 4D3 includes the same two tiers (Tier 0 and Tier 1), Joint Region and two sub-blocks (SB0 and SB1) as FIG. 4C1. The structure of FIG. 4D3 includes the same drain side select layers SGD0, SGD1 and SGD2 (that form select lines); source side select layers SGS0, SGS1, and SGS2 (that form select lines); data word lines (WL0-WL269); and dummy word lines (D0L, D0U, D1L, D1U) as FIG. 4D1. Thus, the first tier (Tier 0) comprises word lines WL0-WL134 and the second tier (Tier 1), which is positioned above Tier 0, comprises word lines WL135-WL269. Similarly, the first sub-block SB0 comprises word lines WL0-WL134 and the second sub-block SB1 comprises word lines WL135-WL269; therefore, Tier 0 is operated as sub-block SB0 and Tier 1 is operated as sub-block SB1. However, in other examples, the tiers may correspond to different sub-blocks or sub-blocks may correspond to partial tiers or more than one tier.

A difference between the structure of FIG. 4D3 and the structure of FIG. 4D1 is that in FIG. 4D3 the word lines in Tier 1 and sub-block SB1 have a relaxed (larger) word line to word line pitch than the word lines in Tier 0 and sub-block SB0. For purposes of this document, the term "word line to word line pitch" refers to the distance from an edge of a word line to the same edge of a neighboring (or adjacent) word line. For example, FIG. 4D3 shows a first word line to word line pitch WP1 for SB0 and Tier 0, where (for example purposes) WP1 is depicted as measured from the top edge of WL133 to the top edge of WL134. The word line to word line pitch WP1 is the same for all word lines of SB0 and Tier 0 for the structure of FIG. 4D3.

FIG. 4D3 also shows a second word line to word line pitch WP2 for SB1 and Tier 1, where (for example purposes) WP2 is depicted as measured from the top edge of WL136 to the top edge of WL137. The word line to word line pitch WP2 is the same for all word lines of SB1 and Tier 1 for the structure of FIG. 4D3. In the embodiment of FIG. 4D3, WP2>WP1, that is, the second word line to word line pitch WP2 is larger than the first word line to word line pitch WP1. In one example, WP1=42 nm and WP2=43 nm; however, other dimensions can also be implemented.

FIG. 4D3 includes arrow 502 to depict the direction of programming for Tier 0 and SB0 and arrow 504 to depict the direction of programming for Tier 1 and SB1. For example, the Tier 0 has a first end opposite the joint region; Tier 1 has a second end opposite the joint region; the memory cells of the Tier 0 are configured to be programmed on a word line by word line basis in a direction from the joint towards the first end as per arrow 502; and the memory cells of the Tier 1 are configured to be programmed on a word line by word line basis in a direction from the joint towards the second end as per arrow 504. In other words, the control circuit is configured to program memory cells of the Tier 1 on a word line by word line basis in a direction towards the bit lines and program memory cells of the Tier 0 on a word line by word line basis in a direction towards the one or more source lines. In one embodiment, instead of having a single source line, the memory may include multiple source lines connected to the NAND strings at the opposite side of the NAND strings from the bit lines.

FIG. 4D4 depicts a portion of another embodiment of a three dimensional memory structure 202 showing a cross-sectional view along line AA of FIG. 4B. The embodiment of FIG. 4D4 corresponds to the structure of FIG. 4C2. This cross sectional view cuts through vertical columns (NAND strings) 472 and 474 of region 470. The structure of FIG.

4D3 includes the same three tiers (Tier 0, Tier 1 and Tier 2), two Joint Regions and two sub-blocks (SB0 and SB1) as FIGS. 4C2z and 4D2. The structure of FIG. 4D4 includes the same drain side select layers SGD0, SGD1 and SGD2 (that form select lines); source side select layers SGS0, SGS1, and SGS2 (that form select lines); data word lines (WL0-WL269); and dummy word lines (D0L, D0U, D1L, D1U) as FIG. 4D2. Thus, the first tier (Tier 0) comprises word lines WL0-WL89, the second tier (Tier 1) comprises word lines WL90-WL179 and the third tier (Tier 2) comprises word lines WL180-WL269. Similarly, the first sub-block SB0 comprises word lines WL0-WL89, the second sub-block SB1 comprises word lines WL90-WL179, and the third sub-block SB2 comprises word lines WL1800-WL269. In the embodiment of FIG. 4D4, Tier 0 and the bottom portion of Tier 1 are operated as sub-block SB0, and Tier 2 and the top portion of Tier 1 are operated as sub-block SB1. However, in other examples, the tiers may correspond to different sub-blocks.

A difference between the structure of FIG. 4D4 and the structure of FIG. 4D3 is that in FIG. 4D4 the word lines in sub-block SB1 (Tier 2 and top of Tier 1) have a relaxed (larger) word line to word line pitch than the word lines in sub-block SB0 (Tier 0 and bottom of Tier 1). For example, FIG. 4D4 shows a first word line to word line pitch WP1 for SB0, where an example of WP1 is depicted as measured from the top edge of WL90 to the top edge of WL91. The word line to word line pitch WP1 is the same for all word lines of SB0 (including all word lines of Tier 0 and word lines WL90-WL133 in the bottom of Tier 1) for the structure of FIG. 4D4.

FIG. 4D4 also shows a second word line to word line pitch WP2 for SB1. An example of WP2 is depicted as measured from the top edge of WL268 to the top edge of WL269. The word line to word line pitch WP2 is the same for all word lines of SB1 (including all word lines of Tier 2 and word lines WL136-WL179 at the top of Tier 1) for the structure of FIG. 4D4. In the embodiment of FIG. 4D4, WP2>WP1; that is, the second word line to word line pitch WP2 is larger than the first word line to word line pitch WP1. In one example, WP1=42 nm and WP2=43 nm; however, other dimensions can also be implemented.

Thus, for example, the middle tier (Tier 1) is split into a top portion and a bottom portion; word lines in the top portion of the middle tier are separated by the second word line to word line pitch WP2; word lines in the bottom portion of the middle tier are separated by the first word line to word line pitch WP1; the Tier 0 and the bottom portion of the middle tier (Tier 1) are configured to together be operated as a first sub-block SB0; and Tier 2 and the top portion of the middle tier (Tier 1) are configured to together be operated as a second sub-block SB1.

FIG. 4D4 includes arrow 520 to depict the direction of programming for SB0 and arrow 522 to depict the direction of programming for SB1. For example, the control circuit is configured to program memory cells of the SB1 on a word line by word line basis in a direction towards the bit lines and program memory cells of the SB0 on a word line by word line basis in a direction towards the one or more source lines.

Figure 4E:
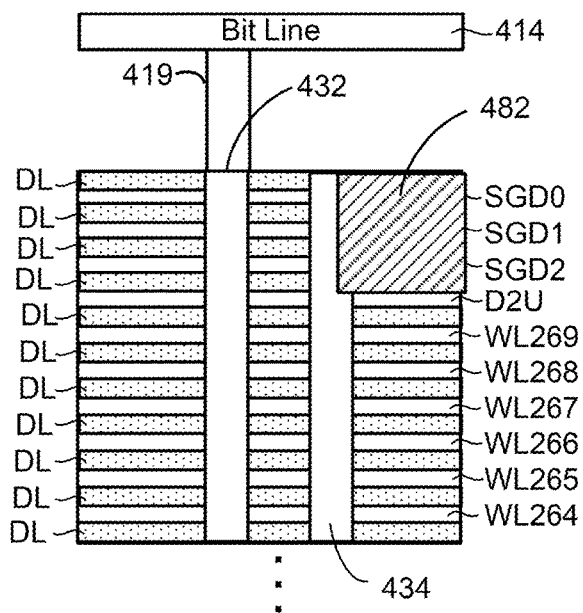
FIG. 4E depicts a cross sectional view of a portion of one embodiment of a block of memory cells.

FIG. 4E depicts a portion of one embodiment of a three dimensional memory structure 202 showing a cross-sectional view along line BB of FIG. 4B. This cross sectional view cuts through vertical columns (NAND strings) 432 and 434 of region 430 (see FIG. 4B). FIG. 4E shows the same alternating conductive and dielectric layers as FIGS. 4D1-4D4. FIG. 4E also shows isolation region 482. Isolation regions 480, 482, 484, 486 and 488) occupy space that would have been used for a portion of the memory holes/vertical columns/NAND strings. For example, isolation region 482 occupies space that would have been used for a portion of vertical column 434. More specifically, a portion (e.g., half the diameter) of vertical column 434 has been removed in layers SDG0, SGD1, SGD2, and DD0 to accommodate isolation region 482. Thus, while most of the vertical column 434 is cylindrical (with a circular cross section), the portion of vertical column 434 in layers SDG0, SGD1, and SGD2 has a semi-circular cross section. In one embodiment, after the stack of alternating conductive and dielectric layers is formed, the stack is etched to create space for the isolation region and that space is then filled in with $SiO_2$.

FIG. 4F depicts a cross sectional view of region 429 of FIG. 4D1 that includes a portion of vertical column 472. In one embodiment, the vertical columns are round; however, in other embodiments other shapes can be used. In one embodiment, vertical column 472 includes an inner core layer 490 that is made of a dielectric, such as $SiO_2$. Other materials can also be used. Surrounding inner core 490 is polysilicon channel 491. Materials other than polysilicon can also be used. Note that it is the channel 491 that connects to the bit line and the source line. Surrounding channel 491 is a tunneling dielectric 492. In one embodiment, tunneling dielectric 492 has an ONO structure. Surrounding tunneling dielectric 492 is charge trapping layer 493, such as (for example) Silicon Nitride. Other memory materials and structures can also be used. The technology described herein is not limited to any particular material or structure.

FIG. 4F depicts dielectric layers DL, as well as word line layers WL264, WL265, WL266, WL267, and WL268. Each of the word line layers includes a word line region 496 surrounded by an aluminum oxide layer 497, which is surrounded by a blocking oxide layer 498. In other embodiments, the blocking oxide layer can be a vertical layer parallel and adjacent to charge trapping layer 493. The physical interaction of the word line layers with the vertical column forms the memory cells. Thus, a memory cell, in one embodiment, comprises channel 491, tunneling dielectric 492, charge trapping layer 493, blocking oxide layer 498, aluminum oxide layer 497 and word line region 496. For example, word line layer WL268 and a portion of vertical column 472 comprise a memory cell MC1. Word line layer WL267 and a portion of vertical column 472 comprise a memory cell MC2. Word line layer WL266 and a portion of vertical column 472 comprise a memory cell MC3. Word line layer WL265 and a portion of vertical column 472 comprise a memory cell MC4. Word line layer WL264 and a portion of vertical column 472 comprise a memory cell MC5. In other architectures, a memory cell may have a different structure; however, the memory cell would still be the storage unit.

When a memory cell is programmed, electrons are stored in a portion of the charge trapping layer 493 which is associated with (e.g. in) the memory cell. These electrons are drawn into the charge trapping layer 493 from the channel 491, through the tunneling dielectric 492, in response to an appropriate voltage on word line region 496. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as GIDL.

Figure 4G:
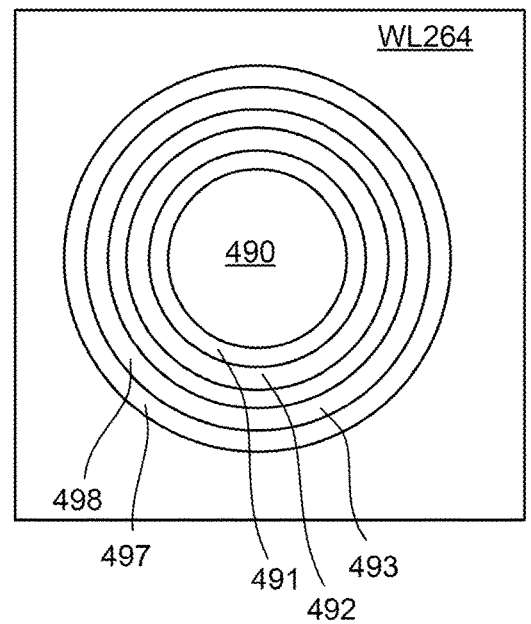
FIG. 4G depicts a cross section of as memory hole that implements a vertical NAND string.

FIG. 4G shows a cross section of vertical column 472 of FIG. 4F, cut through MC5. Thus, FIG. 4G depicts word line layer WL264, inner core 490, channel 491, tunneling dielectric 492, charge trapping layer 493, aluminum oxide layer 497, and blocking oxide layer 498.

Figure 4H:
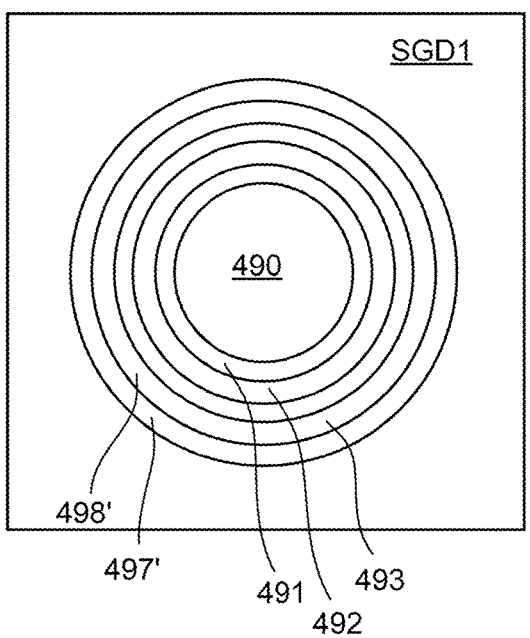
FIG. 4H depicts a cross section of as memory hole that implements a vertical NAND string.

FIG. 4H shows a cross section of vertical column 472 cut through SGD1 (a select gate layer implementing a select gate). Thus, FIG. 4H depicts drain side select line layer SGD1, inner core 490, channel 491, tunneling dielectric 492, charge trapping layer 493, aluminum oxide layer 497, and blocking oxide layer 498.

Figure 4I:
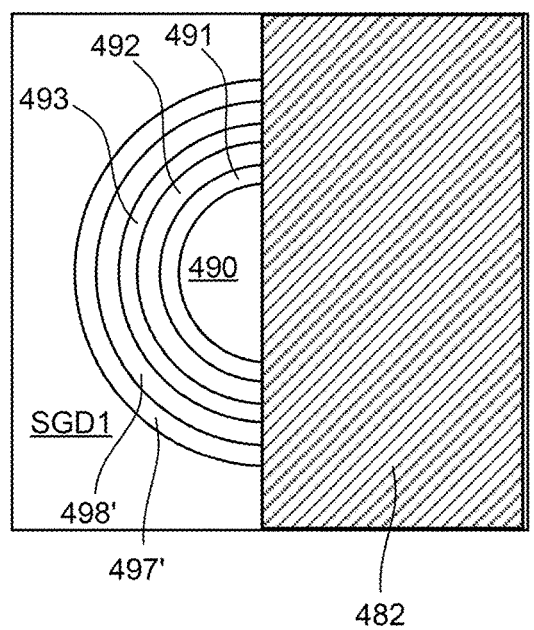
FIG. 4I depicts a cross section of as memory hole that implements a vertical NAND string.

FIG. 4I shows a cross section of vertical column 434 cut through SGD1. Thus, FIG. 4I depicts drain side select line layer SGD1, inner core 490, channel 491, tunneling dielectric 492, charge trapping layer 493, aluminum oxide layer 497, and blocking oxide layer 498. FIG. 4I also shows a portion of isolation region 482. As can be seen in FIG. 4I, the select gate (select gate layer) of vertical column 434 is semicircular in shape (or partially circular in shape) due to vertical column (NAND string) 434 intersecting isolation region 482. Note that the structures depicted in FIGS. 4E-4I apply to the embodiments of FIGS. 4C1, 4C2, 4D1, 4D2, 4D3 and 4D4.

Figure 4J:
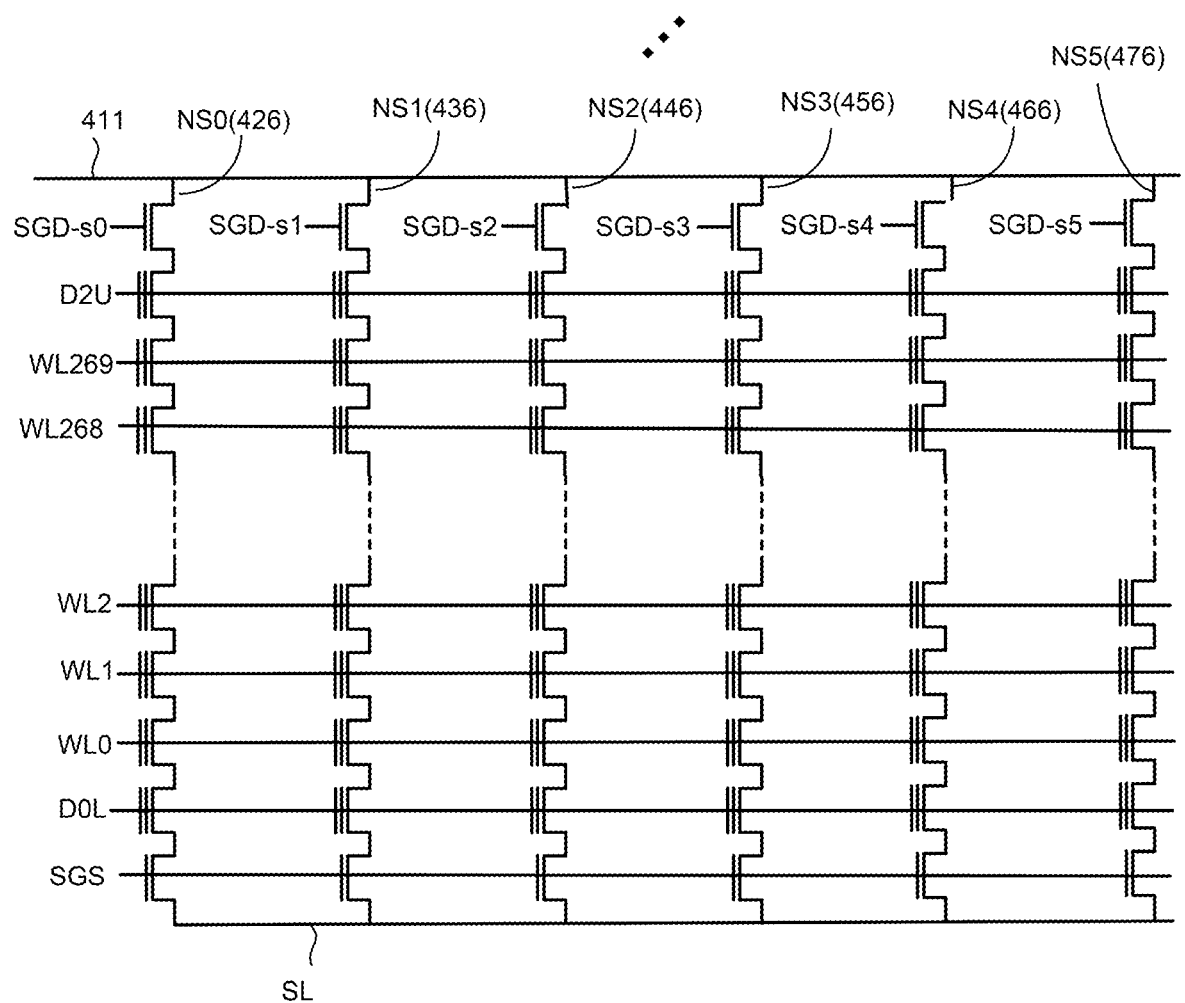
FIG. 4J is a schematic of a plurality of NAND strings.

FIG. 4J is a schematic diagram of a portion of the memory array 202 depicted in FIGS. 4-4I. FIG. 4J shows physical data word lines WL0-WL269 running across the block. The structure of FIG. 4J corresponds to a portion 406 in Block 2 of FIG. 4A, including bit line 411. Within the block, in one embodiment, each bit line is connected to six NAND strings. Thus, FIG. 4J shows bit line 411 connected to NAND string NS0 (which corresponds to vertical column 426), NAND string NS1 (which corresponds to vertical column 436), NAND string NS2 (which corresponds to vertical column 446), NAND string NS3 (which corresponds to vertical column 456), NAND string NS4 (which corresponds to vertical column 466), and NAND string NS5 (which corresponds to vertical column 476). As mentioned above, in one embodiment, SGD0, SGD1 and SGD2 are connected together to operate as a single logical select gate for each region separated by isolation regions (480, 482, 484, 486 and 486) to form SGD-s0, SGD-s1, SGD-s2, SGD-s3, SGD-s4, and SGD-s5. SGS0, SG1 and SGS2 are also connected together to operate as a single logical select gate that is represented in FIG. 4J as SGS. Although the select gates SGD-s0, SGD-s1, SGD-s2, SGD-s3, SGD-s4, and SGD-s5 are isolated from each other due to the isolation regions, the data word lines WL0-WL269 are connected to data memory cells in each region (e.g., 420, 430, 44, 450, 460 and 470) of the block. FIG. 4J only shows the NAND strings connected to bit line 411. However, a full schematic of the block would show every bit line and six vertical NAND strings connected to each bit line.

Although the example memories of FIGS. 4-4J is a three dimensional memory structure that includes vertical NAND strings with charge-trapping material, other (2D and 3D) memory structures can also be used with the technology described herein.

Figure 5A:
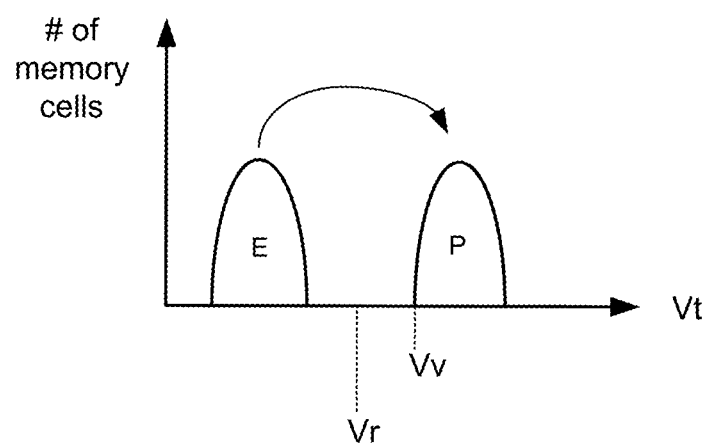
FIG. 5A depicts threshold voltage distributions.

The memory systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read compare voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv.

FIGS. 5B-F illustrate example threshold voltage distributions for the memory array when each memory cell stores multiple bit per memory cell data. Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores two bits of data. Other embodiments may use other data capacities per memory cell (e.g., such as three, four, five or six bits of data per memory cell).

Figure 5B:
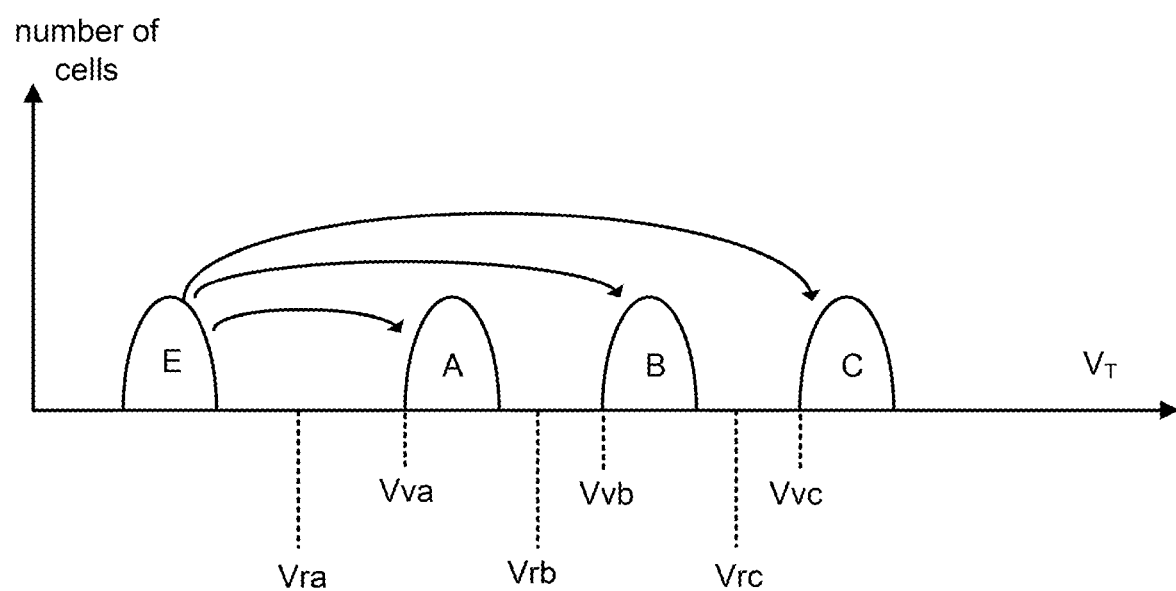
FIG. 5B depicts threshold voltage distributions.

FIG. 5B shows a first threshold voltage distribution E for erased memory cells. Three threshold voltage distributions A, B and C for programmed memory cells are also depicted. In one embodiment, the threshold voltages in the distribution E are negative and the threshold voltages in distributions A, B and C are positive. Each distinct threshold voltage distribution of FIG. 5B corresponds to predetermined values for the set of data bits. In one embodiment, each bit of data of the two bits of data stored in a memory cell are in different logical pages, referred to as a lower page (LP) and an upper page (UP). In other embodiments, all bits of data stored in a memory cell are in a common logical page. The specific relationship between the data programmed into the memory cell and the threshold voltage levels of the cell depends upon the data encoding scheme adopted for the cells. Table 1 provides an example encoding scheme.

TABLE 1

|    | E | A | B | C |
|----|---|---|---|---|
| LP | 1 | 0 | 0 | 1 |
| UP | 1 | 1 | 0 | 0 |

In one embodiment, known as full sequence programming, memory cells can be programmed from the erased data state E directly to any of the programmed data states A, B or C using the process of FIG. 6 (discussed below). For example, a population of memory cells to be programmed may first be erased so that all memory cells in the population are in erased data state E. Then, a programming process is used to program memory cells directly into data states A, B, and/or C. For example, while some memory cells are being programmed from data state E to data state A, other memory cells are being programmed from data state E to data state B and/or from data state E to data state C. The arrows of FIG. 5B represent the full sequence programming. In some embodiments, data states A-C can overlap, with memory controller 120 (or control die 211) relying on error correction to identify the correct data being stored.

Figure 5C:
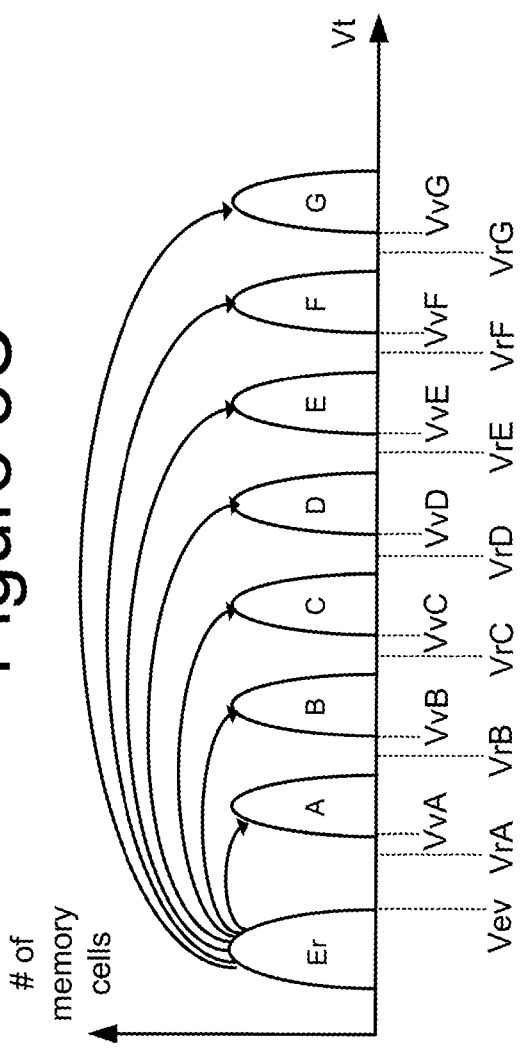
FIG. 5C depicts threshold voltage distributions.

FIG. 5C depicts example threshold voltage distributions for memory cells where each memory cell stores three bits of data per memory cells (which is another example of MLC data). FIG. 5C shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. Table 2 provides an example of an encoding scheme for embodiments in which each bit of data of the three bits of data stored in a memory cell are in different logical pages, referred to as a lower page (LP), middle page (MP) and an upper page (UP).

TABLE 2

|    | Er | A | B | C | D | E | F | G |
|----|----|---|---|---|---|---|---|---|
| UP | 1  | 1 | 1 | 0 | 0 | 0 | 0 | 1 |
| MP | 1  | 1 | 0 | 0 | 1 | 1 | 0 | 0 |
| LP | 1  | 0 | 0 | 0 | 0 | 1 | 1 | 1 |

FIG. 5C shows seven read compare voltages, VrA, VrB, VrC, VrD, VrE, VrF, and VrG for reading data from memory cells. By testing (e.g., performing sense operations) whether the threshold voltage of a given memory cell is above or below the seven read compare voltages, the system can determine what data state (i.e., A, B, C, D, . . . ) a memory cell is in.

FIG. 5C also shows seven verify compare voltages, VvA, VvB, VvC, VvD, VvE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 5C also shows Vev, which is a voltage level to test whether a memory cell has been properly erased.

In an embodiment that utilizes full sequence programming, memory cells can be programmed from the erased data state Er directly to any of the programmed data states A-G using the process of FIG. 6 (discussed below). For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state ER to data state A, other memory cells are being programmed from data state ER to data state B and/or from data state ER to data state C, and so on. The arrows of FIG. 5C represent the full sequence programming. In some embodiments, data states A-G can overlap, with control die 211 and/or memory controller 120 relying on error correction to identify the correct data being stored. Note that in some embodiments, rather than using full sequence programming, the system can use multi-pass programming processes known in the art.

In general, during verify operations and read operations, the selected word line is connected to a voltage (one example of a reference signal), a level of which is specified for each read operation (e.g., see read compare voltages VrA, VrB, VrC, VrD, VrE, VrF, and VrG, of FIG. 5C) or verify operation (e.g. see verify target voltages VvA, VvB, VvC, VvD, VvE, VvF, and VvG of FIG. 5C) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 5D:
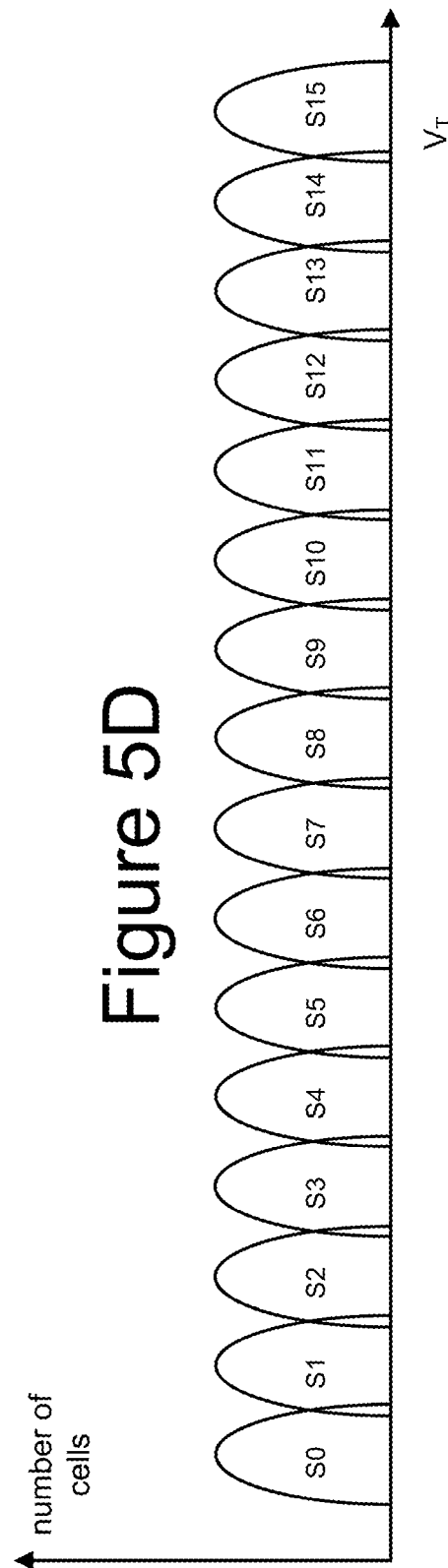
FIG. 5D depicts threshold voltage distributions.

FIG. 5D depicts threshold voltage distributions when each memory cell stores four bits of data, which is another example of MLC data. FIG. 5D depicts that there may be some overlap between the threshold voltage distributions (data states) S0-S15. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible. Changing the read compare voltages can help to mitigate such effects. Using ECC during the read process can fix errors and ambiguities. Note that in some embodiments, the threshold voltage distributions for a population of memory cells storing four bits of data per memory cell do not overlap and are separated from each other; for example, as depicted in FIG. 5E. The threshold voltage distributions of FIG. 5D will include read compare voltages and verify compare voltages, as discussed above.

When using four bits per memory cell, the memory can be programmed using the full sequence programming discussed above, or multi-pass programming processes known in the art. Each threshold voltage distribution (data state) of FIG. 5D corresponds to predetermined values for the set of data bits. The specific relationship between the data programmed into the memory cell and the threshold voltage levels of the cell depends upon the data encoding scheme adopted for the cells. Table 3 provides an example of an encoding scheme for embodiments in which each bit of data of the four bits of data stored in a memory cell are in different logical pages, referred to as a lower page (LP), middle page (MP), an upper page (UP) and top page (TP).

TABLE 3

|    | S0 | S1 | S2 | S3 | S4 | S5 | S6 | S7 | S8 | S9 | S10 | S11 | S12 | S13 | S14 | S15 |
|----|----|----|----|----|----|----|----|----|----|----|-----|-----|-----|-----|-----|-----|
| TP | 1  | 1  | 1  | 1  | 1  | 0  | 0  | 0  | 0  | 0  | 1   | 1   | 0   | 0   | 0   | 1   |
| UP | 1  | 1  | 0  | 0  | 0  | 0  | 0  | 0  | 1  | 1  | 1   | 1   | 1   | 1   | 0   | 0   |
| MP | 1  | 1  | 1  | 0  | 0  | 0  | 0  | 1  | 1  | 0  | 0   | 0   | 0   | 1   | 1   | 1   |
| LP | 1  | 0  | 0  | 0  | 1  | 1  | 0  | 0  | 0  | 0  | 0   | 1   | 1   | 1   | 1   | 1   |

FIG. 5F depicts threshold voltage distributions when each memory cell stores five bits of data, which is another example of MLC data. In one example implementation, when memory cells store five bits of data, the data is stored in any of thirty two data state (e.g., S0-S31).

Figure 6:
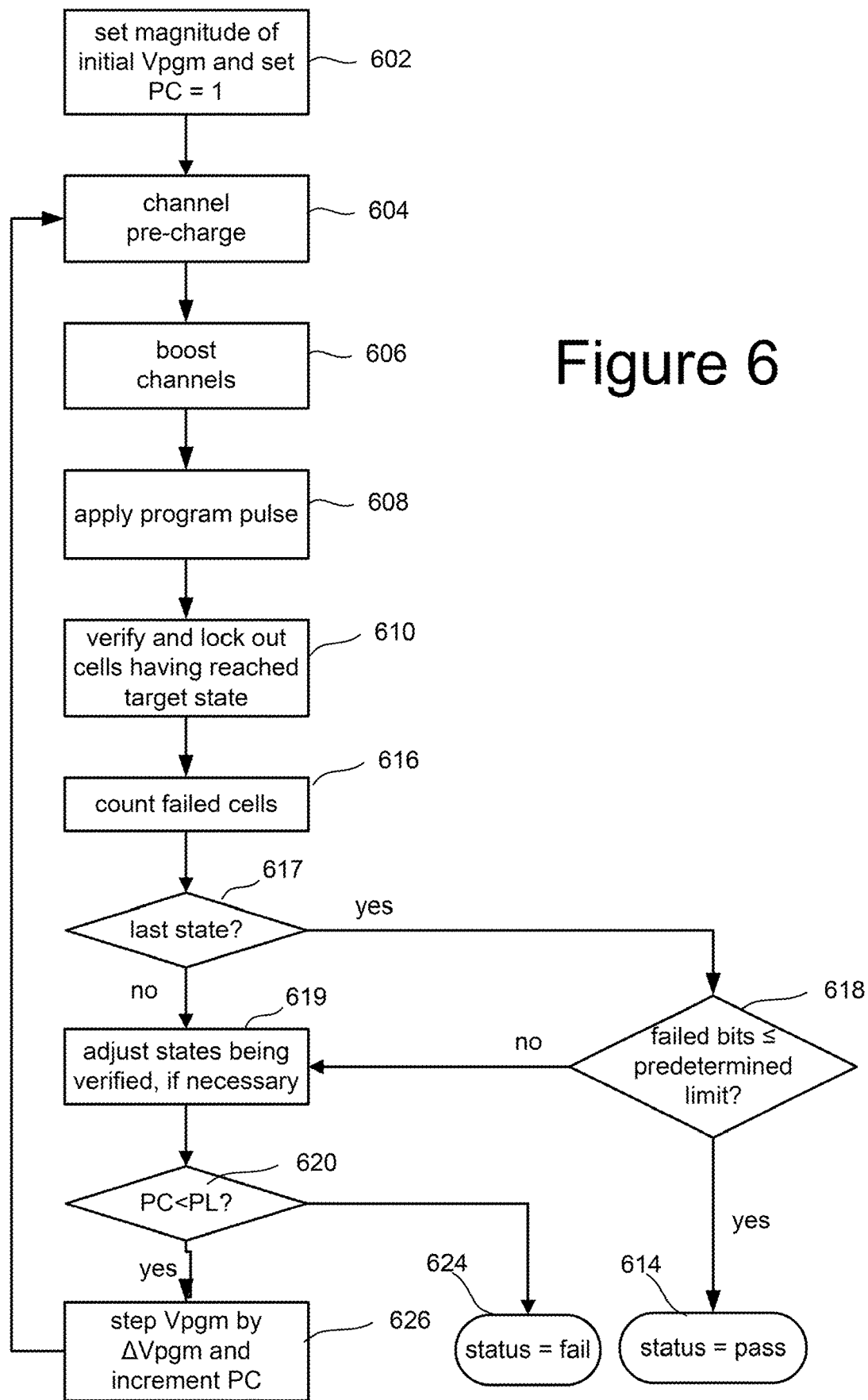
FIG. 6 is a flow chart describing one embodiment of a process for programming non-volatile memory cells connected to a common word line.

FIG. 6 is a flowchart describing one embodiment of a process for programming memory cells. For purposes of this document, the term program and programming are synonymous with write and writing. In one example embodiment, the process of FIG. 6 is performed for memory array 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory die 201. The process includes multiple loops (referred to as program loops), each of which includes a program phase and a verify phase. The process of FIG. 6 is performed to implement the full sequence programming, as well as other programming schemes including multi-pass programming, which comprises programming processes that use multiple passes to complete programming. When implementing multi-pass programming, the process of FIG. 6 is used to implement any/each pass of the multi-pass programming process.

Typically, the program voltage applied to the control gates (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In some embodiments, pre-charging the channels of unselected NAND strings cleans out the channel of electrons and raises the channel to a low positive voltage (e.g., approximately 1-1.3 v). In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts), also referred to as pass voltages, to perform boosting schemes. A program inhibit voltage is applied to the bit lines coupled the unselected NAND string. In one embodiment, for example, the channel is pre-charged to ~2 volts in step 604 and then floated. In step 606, the channel is boosted up from the 2 volts to a boosting voltage of approximately 8-10 volts.

In step 608, a program voltage pulse of the programming voltage signal Vpgm is applied to the selected word line (the word line selected for programming). In some embodiments, the magnitude and/or pulse width of the program voltage pulse can be modified from the standard magnitude and/or pulse width by one or more offsets, as described below. If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program-verify is performed and memory cells that have reached their target states are locked out from further programming by the control die. Step 610 includes performing verification of programming by sensing at one or more verify compare levels. In one embodiment, the verification process is performed by testing whether the threshold voltages of the memory cells selected for programming have reached the appropriate verify compare voltage. In one embodiment that corresponds to FIG. 5C, the process of FIG. 6 is concurrently performed for memory cells being programmed to data states A, B, C, D, E, F and G. In one embodiment, step 610 can include testing for each of data states A, B, C, D, E, F and G (e.g., testing to see whether memory cells have threshold voltages greater than VvA, VvB, VvC, VvD, VvE, VvF, and VvG). In another embodiment, the system only tests for a subset of data states A, B, C, D, E, F and G during each loop of steps 604-626 based on the current threshold voltages of the memory cells, in what is known as a smart verify process. In step 610, a memory cell may be locked out after the memory cell has been verified (by a test of the Vt) that the memory cell has reached its target state.

If, in step 612, it is determined that all of the memory cells have reached their target threshold voltages (pass), the programming process is complete and successful because all selected memory cells were programmed and verified to their target states. A status of "PASS" is reported in step 614. Otherwise, if in step 612, it is determined that not all of the memory cells have reached their target threshold voltages (fail), then the programming process continues to step 616.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 620 and the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process loops back to step 604 and another program pulse is applied to the selected word line (by the control die) so that another loop (steps 604-626) of the programming process of FIG. 6 is performed. The loop (steps 604-626) of the programming process of FIG. 6 is referred to as a program loop.

In one embodiment memory cells are erased prior to programming. Erasing is the process of changing the threshold voltage of one or more memory cells from a programmed data state to an erased data state. For example, changing the threshold voltage of one or more memory cells from state P to state E of FIG. 5A, from states A/B/C to state E of FIG. 5B, from states A-G to state Er of FIG. 5C or from states S1-S15 to state S0 of FIG. 5D.

One technique to erase memory cells in some memory devices is to bias a p-well (or other types of) substrate to a high voltage to charge up a NAND channel. An erase enable voltage (e.g., a low voltage) is applied to control gates of memory cells while the NAND channel is at a high voltage to erase the memory cells. Herein, this is referred to as p-well erase.

Another approach to erasing memory cells is to generate gate induced drain leakage ("GIDL") current to charge up the NAND string channel. An erase enable voltage is applied to control gates of the memory cells, while maintaining the NAND string channel potential to erase the memory cells. Herein, this is referred to as GIDL erase. Both p-well erase and GIDL erase may be used to lower the threshold voltage (Vt) of memory cells.

In one embodiment, the GIDL current is generated by causing a drain-to-gate voltage at a GIDL generation transistor (e.g., transistors connected to SGDT0, SGDT1, SGDT2, SGSB0, SGSB1 and SGSB2). In some embodiments, a select gate (e.g., SGD or SGS) can be used as a GIDL generation transistor. A transistor drain-to-gate voltage that generates a GIDL current is referred to herein as a GIDL voltage. The GIDL current may result when the GIDL generation transistor drain voltage is significantly higher than the GIDL generation transistor control gate voltage. GIDL current is a result of carrier generation, i.e., electron-hole pair generation due to band-to-band tunneling and/or trap-assisted generation. In one embodiment, GIDL current may result in one type of carriers (also referred to a charge carriers), e.g., holes, predominantly moving into the NAND channel, thereby raising or changing the potential of the channel. The other type of carriers, e.g., electrons, are extracted from the channel, in the direction of a bit line or in the direction of a source line, by an electric field. During erase, the holes may tunnel from the channel to a charge storage region of the memory cells (e.g., to charge trapping layer 493) and recombine with electrons there, to lower the threshold voltage of the memory cells.

The GIDL current may be generated at either end (or both ends) of the NAND string. A first GIDL voltage may be created between two terminals of a GIDL generation transistor (e.g., connected to SGDT0, SGDT1, SGDT2) that is connected to or near a bit line to generate a first GIDL current. A second GIDL voltage may be created between two terminals of a GIDL generation transistor (e.g., SGSB0, SGSB1 and SGSB2) that is connected to or near a source line to generate a second GIDL current. Erasing based on GIDL current at only one end of the NAND string is referred to as a one-sided GIDL erase. Erasing based on GIDL current at both ends of the NAND string is referred to as a two-sided GIDL erase. The technology described herein can be used with one-sided GIDL erase and two-sided GIDL erase.

The discussion above with respect to FIG. 6 describes a process for programming non-volatile memory cells connected to a common word line. In some cases, however, an amount of data is received for programming that is too large to be stored on one word line. Therefore, the data needs to be stored in non-volatile memory cells connected to multiple word lines.

FIG. 7 is a flow chart describing one embodiment of a process for programming non-volatile memory cells connected to multiple word lines. The process of FIG. 7 can be performed by any one of the control circuits discussed above. For example, the process of FIG. 7 can be performed entirely by the memory die 200 (see FIG. 2A) or by the integrated memory assembly 207 (see FIG. 2B), rather than by memory controller 120. In one example, the process of FIG. 7 is performed by or at the direction of state machine 262, using other components of System Control Logic 260, Column Control Circuitry 210 And Row Control Circuitry 220. In another embodiment, the process of FIG. 7 is performed by or at the direction of memory controller 120.

In step 702 of FIG. 7, the control circuit receives data (e.g., from host 102 or another entity). The amount of data received is too large to be stored on one word line. Therefore, the data needs to be stored in non-volatile memory cells connected to multiple word lines. In step 704, the control circuit chooses a sub-block, which includes choosing a block and a sub-block of the chosen block, to store the received data. In step 706, an initial word line is chosen. For example, if the sub-block is completely erased and not storing any data than an end word line can be chosen (e.g., WL134 for SB0 or WL135 of SB1 for the embodiment of FIG. 4D3). In step 708, the control circuit programs a portion of the received data into the current word line using the process of FIG. 6. In step 710, it is determined if more data needs to be programmed. If not, the control circuit reports back to the host (or other entity) that programming has been completed in step 712. If there is more data to be programmed, then the next word line for programming needs to be chosen. If the control circuit is programming SB0 (see step 714) then the next word line chosen (step 716) is the adjacent word line in the source line direction. That is WLx=WLx−1. So if the current word line being programmed is WL40 then the next word line chosen is WL39. If the control circuit is programming SB1 (see step 714) then the next word line chosen (step 718) is the adjacent word line in the bit line direction. That is WLx=WLx+1. So if the current word line being programmed is WL230 then the next word line chosen is WL231. After choosing the next word line (step 716 or step 718), the process loops back to step 708 to program the memory cells connected to the newly chosen word line. In this manner, the process of FIG. 7 includes the control circuit programming on a word line by word line basis in a direction according to arrows 502/504 for a two tier architecture (see e.g., FIG. 4D3) or according to arrows 520/522 for a three tier architecture (see e.g., FIG. 4D4).

Figure 8A:
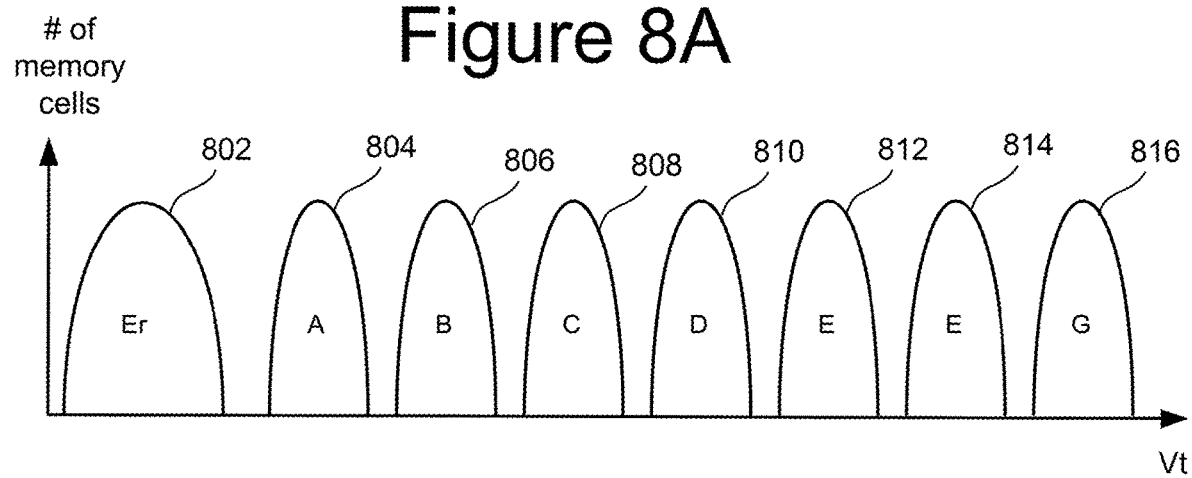
FIG. 8A depicts threshold voltage distributions.
Figure 8B:
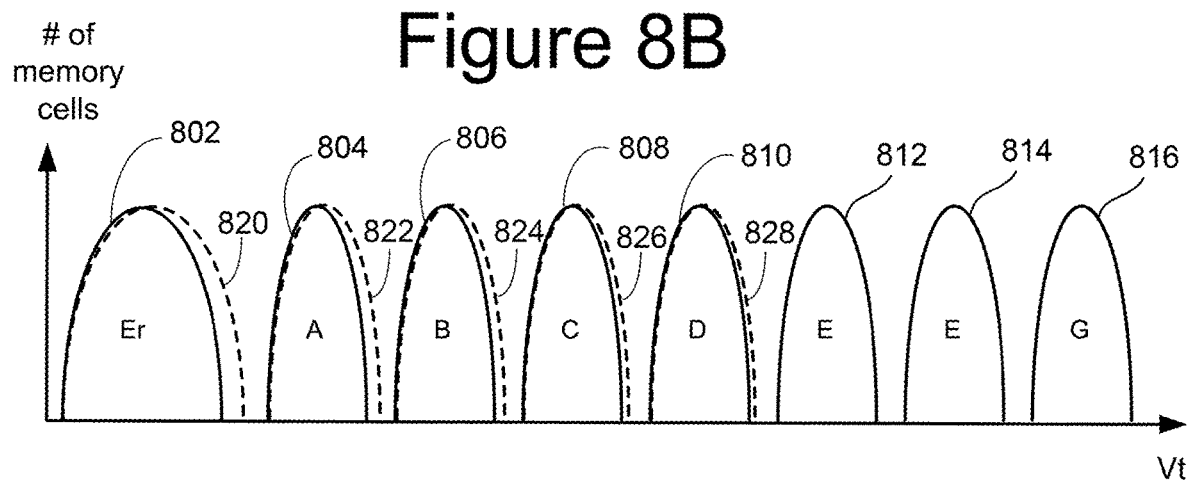
FIG. 8B depicts threshold voltage distributions.

When programming memory cells using the processes of FIG. 7 (or other programming processes), the memory cells are programmed to a set of threshold voltage distributions (see e.g., FIGS. 5A-F). The memory system is engineered such that the set of threshold voltage distributions account for interference from other memory cells, capacitive coupling from other memory cells, drift over time, other data retention issues, programming errors, read errors, etc. Due to the different order of programming of SB0 and SB1 (see e.g., FIG. 4D3 and FIG. 4D4), different sub-blocks may program to different sets of threshold voltage distributions. For example, FIG. 8A shows threshold voltage distributions 802, 804, 806, 808, 810, 812, 814 and 816 for an ideal memory where SB0 and SB1 program to the exact same threshold voltage distributions. However, in many cases, the memory cells of SB1 (using the order of programming discussed above with respect to FIG. 4D3 and FIG. 4D4) may experience more interference from memory cells on neighboring word lines than the memory cells of SB0. For example, FIG. 8B depicts threshold voltage distributions 820, 822, 824, 826 and 828 that deviate from (and are wider than) corresponding threshold voltage distributions 802, 804, 806, 808 and 810, respectively, due to the memory cells of SB1 experiencing more interference from memory cells on neighboring word lines than the memory cells of SB0. This deviation is one example, of the differences in how the tiers/sub-blocks perform memory operations. As device size shrinks, differences in how the tiers/sub-blocks perform memory operations become more evident and these differences make it difficult to reliably operate the memory. To address this issue, it is proposed to use different word line to word line pitches in the different tiers and/or different sub-blocks. For example, it is proposed to use the structures of FIG. 4D3 and FIG. 4D4. Thus, one embodiment includes word lines in the first tier being separated by a first word line to word line pitch and word lines in the second tier being separated by a second word line to word line pitch such that the first word line to word line pitch is different than the second word line to word line pitch. In another embodiment, word lines in the first sub-block are separated by the first word line to word line pitch and word lines in the second sub-block are separated by the second word line to word line pitch. Using different word line to word line pitches for the different sub-blocks/tiers, as described above, results in the different sub-blocks/tiers programming data into the same set threshold voltage distributions (e.g., 802-816).

Figure 9:
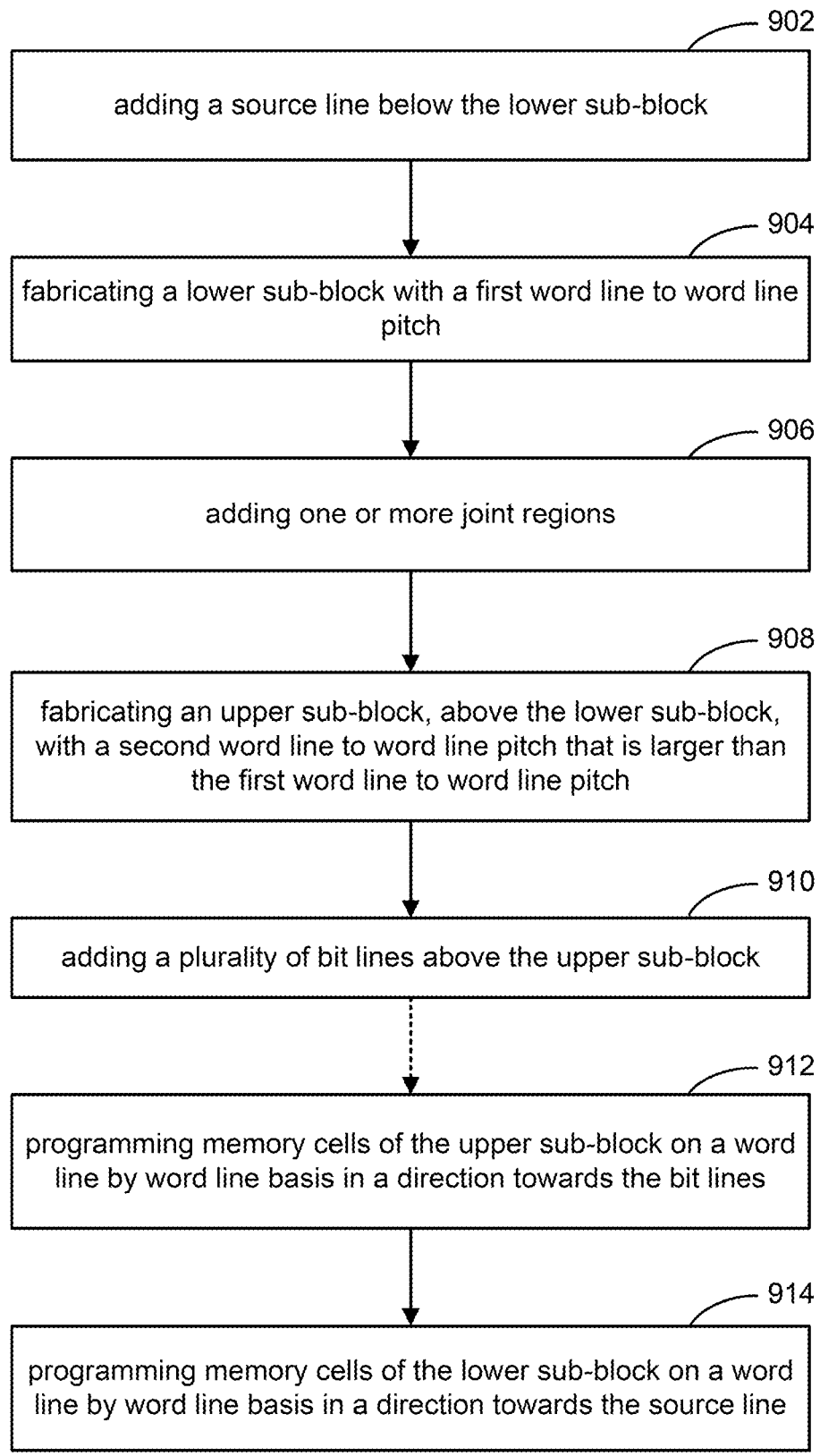
FIG. 9 is a flow chart describing one embodiment of a process for fabricating non-volatile memory.

FIG. 9 is a flow chart describing one embodiment of a process for fabricating non-volatile memory (e.g., fabricating the embodiments of FIG. 4D3 or FIG. 4D4). In step 902, a source line (e.g., SL) is added to the memory structure. This source line will be below the lower sub-block (e.g., SB0). In step 904, a lower sub-block (e.g., SB0) is fabricated and added to the memory structure. Word lines in the lower sub-block are separated by the first word line to word line pitch. In step 906, one or more joint regions are added to the memory structure. In step 908, an upper sub-block (e.g., SB1) is fabricated and added to the memory structure. Word lines in the upper sub-block are separated by the second word line to word line pitch. The second word line to word line pitch is larger than the first word line to word line pitch (e.g., WL2>WP1). In step 910, a plurality of bit lines are added to the memory structure above the upper sub-block.

In step 912, the control circuit programs memory cells of the upper sub-block on a word line by word line basis in a direction towards the bit lines (see e.g., arrows 504/522). The arrow between steps 910 and 912 is dotted to indicate that step 912 can be performed immediately after step 910 (e.g., during the manufacturing and/or test phase) or much later in time (e.g., during user operation). In step 914, the control circuit programs memory cells of the lower sub-block on a word line by word line basis in a direction towards the source line (see e.g., arrows 502/520).

A non-volatile memory has been described that uses different word line to word line pitches in different sub-blocks and/or different tiers in order to achieve uniform performance among the different sub-blocks and/or different tiers.

One embodiment includes a non-volatile memory structure comprising a plurality of non-volatile memory cells and a plurality of word lines connected to the memory cells. The word lines and memory cells are organized into at least a first tier and a second tier. The second tier is positioned above the first tier. The word lines in the first tier are separated by a first word line to word line pitch. The word lines in the second tier are separated by a second word line to word line pitch. The first word line to word line pitch is different than the second word line to word line pitch.

In one example implementation the first tier is a first sub-block and the second tier is a second sub-block.

In one example implementation, the non-volatile memory cells are arranged as NAND strings divided into at least the first tier, the second tier and a middle tier with a first joint region between the first tier and the middle tier, and a second joint region between the second tier and the middle tier. In this example implementation, the middle tier is split into a top portion and a bottom portion, word lines in the top portion of the middle tier are separated by the second word line to word line pitch; and word lines in the bottom portion of the middle tier are separated by the first word line to word line pitch. The first tier and the bottom portion of the middle tier are configured to together be operated as a first sub-block; and the second tier and the top portion of the middle tier are configured to together be operated as a second sub-block.

In one example implementation, the non-volatile memory cells are arranged as NAND strings divided into at least the first tier and the second tier with a joint region between the first tier and the second tier.

In one example implementation, the non-volatile memory structure further comprises a plurality of bit lines, each NAND string is connected to one of the bit lines, each of the word lines is connected to all of the NAND strings; one or more source lines, each NAND string is connected to the one or more source lines; and a control circuit connected to the bit lines, word lines and one or more source lines. The control circuit is configured to program memory cells of the second tier on a word line by word line basis in a direction towards the bit lines, the control circuit is configured to program memory cells of the first tier on a word line by word line basis in a direction towards the one or more source lines. Additionally, in this example implementation, the second word line to word line pitch is greater than the first word line to word line pitch.

One embodiment includes a method of fabricating a non-volatile memory structure, comprising: fabricating a lower sub-block with a first word line to word line pitch; and fabricating an upper sub-block, above the lower sub-block, with a second word line to word line pitch that is larger than the first word line to word line pitch.

One embodiment includes a non-volatile memory structure comprising: a block of non-volatile memory cells arranged as NAND strings divided into two or more sub-blocks, the two or more sub-blocks comprise at least a first sub-block and a second sub-block; a plurality of bit lines, each NAND string is connected to one of the bit lines; a plurality of word lines, each of the word lines is connected to all of the NAND strings, word lines connected to memory cells in the first sub-block are separated by a first word line to word line pitch, word lines connected to memory cells in the second sub-block are separated by a second word line to word line pitch, the second word line to word line pitch is different than the first word line to word line pitch; one or more source lines, each NAND string is connected to the one or more source lines; and a control circuit connected to the bit lines, word lines and one or more source lines. The control circuit is configured to program memory cells of the second sub-block on a word line by word line basis in a direction towards the bit lines. The control circuit is configured to program memory cells of the first sub-block on a word line by word line basis in a direction towards the one or more source lines.

In one example implementation, the word lines and memory cells are arranged as at least a top tier, a lower tier, and a middle tier positioned between the top tier and the lower tier; the middle tier is split into a top portion and a bottom portion; the first sub-block comprises the bottom tier and the bottom portion of the middle tier; the second sub-block comprises the top tier and the top portion of the middle tier; word lines in the top tier and the top portion are separated by the second word line to word line pitch; and word lines in the bottom tier and the bottom portion are separated by the first word line to word line pitch.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile memory structure, comprising:
   a plurality of non-volatile memory cells arranged in a plurality of tiers above a substrate; and
   a plurality of word lines connected to the memory cells, the word lines and memory cells are organized into at least a first tier and a second tier of the plurality of tiers, the second tier is positioned above the first tier, the first tier is the closest tier to the substrate, word lines in the first tier are separated by a first word line pitch, the first word line to word line pitch is different that the second word line to word line pitch, the second word line to word line pitch is larger than the first word line to word line pitch.

2. The non-volatile memory structure of claim 1, wherein:
   the first tier is a first sub-block; and
   the second tier is a second sub-block.

3. The non-volatile memory structure of claim 1, further comprising:
   a joint region, the first tier is separated from the second tier by the joint region.

4. The non-volatile memory structure of claim 3, wherein:
   the first tier has a first end opposite the joint region;
   the memory cells of the first tier are configured to be programmed on a word line by word line basis in a direction from the joint towards the first end; and
   the memory cells of the second tier are configured to be programmed on a word line by word line basis in a direction from the joint towards the second end.

5. The non-volatile memory structure of claim 1, further comprising:
   additional non-volatile memory cells and additional word lines connected to the additional non-volatile memory cells, the additional non-volatile memory cells and the additional word lines are arranged in a middle tier below the second tier and above the first tier.

6. The non-volatile memory structure of claim 5, wherein:
   the middle tier is split into a top portion and a bottom portion;
   word lines in the top portion of the middle tier are separated by the second word line to word line pitch; and
   word lines in the bottom portion of the middle tier are separated by the first word line to word line pitch.

7. The non-volatile memory structure of claim 6, wherein:
   the first tier and the bottom portion of the middle tier are configured to together be operated as a first sub-block; and
   the second tier and the top portion of the middle tier are configured to together be operated as a second sub-block.

8. The non-volatile memory structure of claim 1, further comprising:
   a plurality of bit lines connected to the non-volatile memory cells;
   one or more source lines connected to the non-volatile memory cells; and
   a control circuit connected to the word lines, the bit lines and the one or more source lines;
   the control circuit is configured to program memory cells of the second tier on a word line by word line basis in a direction towards the bit lines, the control circuit is configured to program memory cells of the first tier on a word line by word line basis in a direction towards the one or more source lines.

9. The non-volatile memory structure of claim 1, wherein:
   the non-volatile memory cells are arranged as NAND strings divided into at least the first tier and the second tier with a joint region between the first tier and the second tier.

10. The non-volatile memory structure of claim 9, further comprising:
    a plurality of bit lines, each NAND string is connected to one of the bit lines, each of the word lines is connected to all of the NAND strings;
    one or more source lines, each NAND string is connected to the one or more source lines; and
    a control circuit connected to the bit lines, word lines and one or more source lines;
    the control circuit is configured to program memory cells of the second tier on a word line by word line basis in a direction towards the bit lines, the control circuit is configured to program memory cells of the first tier on a word line by word line basis in a direction towards the one or more source lines, the second word line to word line pitch is larger than the first word line pitch.

11. A method of fabricating a non-volatile memory structure, comprising:
    fabricating a lower sub-block of a block above a substrate, the lower sub-block comprising a first set of data word lines with a first word line to word line pitch; and
    fabricating an upper sub-block of the block, above the lower sub-block, comprising a second set of data word lines with a second word line to word line pitch that is larger than the first word line to word line pitch, the first set of data word lines comprise a first word line that is closest to the substrate as compared to any other word line of the block.

12. The method of claim 11, further comprising:
    adding a joint region between the upper sub-block and the lower sub-block, the fabricating the lower sub-block includes adding multiple word lines at the first word line to word line pitch, the fabricating the upper sub-block includes adding multiple word lines at the second word line to word line pitch.

13. The method of claim 11, further comprising:
    adding a source line below the lower sub-block;
    adding a plurality of bit lines above the upper sub-block;
    programming memory cells of the upper sub-block on a word line by word line basis in a direction towards the bit lines; and
    programming memory cells of the lower sub-block on a word line by word line basis in a direction towards the source line.

14. The method of claim 11, further comprising:
    the fabricating the lower sub-block and the fabricating the upper sub-block comprises fabricating three tiers of word lines separated by joint regions.

15. A non-volatile memory structure, comprising:
    a block of non-volatile memory cells arranged as NAND strings divided into two or more sub-blocks, the two or more sub-blocks comprise at least a first sub-block and a second sub-block;
    a plurality of bit lines, each NAND string is connected to one of the bit lines;
    a plurality of word lines, each of the word lines is connected to all of the NAND strings, word lines connected to memory cells in the first sub-block are separated by a first word line to word line pitch, word lines connected to memory cells in the second sub-block are separated by a second word line to word line pitch, the second word line to word line pitch is different that the first word line to word line pitch;
one or more source lines, each NAND string is connected to the one or more source lines; and
a control circuit connected to the bit lines, word lines and one or more source lines;
the control circuit is connected to program memory cells of the second sub-block on a word line by word line basis in a direction towards the bit lines, the control circuit is configured to program memory cells of the first sub-block on a word line by word line basis in a direction towards the one or more source lines;
the word lines and memory cells are arranged as at least a top tier, a lower tier, and a middle tier positioned between the top tier and the lower tier,
the middle tier is split into a top portion and a bottom portion;
the first sub-block comprises the bottom tier and the bottom portion of the middle tier;
the second sub-block comprises the top tier and the top portion of the middle tier;
word lines in the top tier and the top portion are separated by the second word line to word line pitch; and
word lines in the bottom tier and the bottom portion are separated by the first word line to word line pitch.

16. The non-volatile memory structure of claim 15, wherein:
the second word line to word line pitch is larger than the first word line to word line pitch.

* * * * *